United States Patent [19]

Davie et al.

[11] Patent Number: 4,949,196

[45] Date of Patent: Aug. 14, 1990

[54] METHOD AND APPARATUS FOR ASYMMETRICAL RLL CODING

[75] Inventors: Neil R. Davie, Tucson, Ariz.; Martin A. Hassner, Palo Alto, Calif.; Thomas D. Howell, Los Gatos, Calif.; Razmik Karabed; Paul H. Siegel, both of San Jose, Calif.

[73] Assignee: International Business Machines Corporation, Armonk, N.Y.

[21] Appl. No.: 175,171

[22] Filed: Mar. 30, 1988

Related U.S. Application Data

[63] Continuation-in-part of Ser. No. 874,041, Jun. 13, 1986, abandoned.

[51] Int. Cl.⁵ .................. G11B 5/09; H03K 13/24
[52] U.S. Cl. .................................... 360/40; 341/59
[58] Field of Search .............. 360/39, 40, 48; 369/59; 340/347 DD; 358/261.1

[56] References Cited

U.S. PATENT DOCUMENTS

| | | | |
|---|---|---|---|
| 3,394,352 | 7/1968 | Wernikoff et al. | 340/347 DD |
| 3,685,033 | 8/1972 | Srivastava et al. | 340/ |
| 3,689,899 | 9/1972 | Franaszek . | |
| 3,840,854 | 10/1974 | Franaszek | 340/ |
| 4,028,535 | 6/1977 | Franaszek et al. | 235/ |
| 4,115,768 | 9/1978 | Eggenberger et al. | 340/ |
| 4,337,458 | 6/1982 | Cohn et al. | 340/ |
| 4,338,683 | 7/1982 | Furukawa et al. | 369/59 |
| 4,413,251 | 11/1983 | Adler et al. | 340/ |
| 4,484,176 | 11/1984 | Fitzpatrick | 360/40 |
| 4,488,142 | 12/1984 | Franaszek | 340/ |
| 4,500,982 | 2/1985 | Yoshida | 369/59 |
| 4,547,890 | 10/1985 | Gindi | 340/347 DD |
| 4,571,575 | 2/1986 | McCullough | 360/39 |
| 4,593,375 | 6/1986 | Gershenson | 340/347 DD |
| 4,675,652 | 6/1987 | Machado | 360/40 |

FOREIGN PATENT DOCUMENTS

0070387 6/1982 European Pat. Off. .
0083412 11/1982 European Pat. Off. .
0155529 2/1985 European Pat. Off. .

OTHER PUBLICATIONS

Digital Modulation System, Patent Abstracts of Japan, vol. 9, No. 244 (E-346) [1967], Sep. 30, 1985.
IBM Technical Disclosure Bulletin, vol. 28, No. 3, Aug. 1985.
"Algorithms for Sliding Block Codes", *An Application of Symbolic Dynamics to Information Theory*, by Roy Adler et al., vol. IT-29, No. 1, Jan. 1983, pp. 5–22.

*Primary Examiner*—Vincent P. Canney
*Attorney, Agent, or Firm*—Baker, Maxham, Jester & Meador

[57] ABSTRACT

This disclosure concerns for generating asymmetrically constrained run-length-limited encoded data from a serialized binary string of 1's and 0's. The method comprises the steps of encoding the input data bits using a run-length-limited constraint in the form of M/N (d,k), where M is the number of input data bits, N is the number of output bits associated therewith, d is the minimum number of 0 data bits between adjacent data bit 1's, and k is the maximum number of 0 data bits between adjacent 1's; and alternating the values of d and k between a set $(d_1, k_1)$ and a set $(d_2, k_2)$, respectively, where $d_1 \neq d_2$. The apparatus comprises means for generating N output data bits in response to M input data bits and for generating data bit 0's between data bit 1's based upon a run-length-limited coding constraints $(d_1, k_1)$ and $(d_2, k_2)$, where constraints $(d_1, k_1)$ and $(d_2, k_2)$ apply alternately to runs of zeroes between output data ones. Fractional numerical values of $d_1$ and $d_2$ can be employed in the method or apparatus.

41 Claims, 16 Drawing Sheets

| | | |
|---|---|---|
| 101001 ○ ○ ○ | MFM | CLOCK, .75u<br>RATE = 1/2; 1.5u/BIT |
| 1 1 0 1 ○ ○ ○ | 8/9 (0,3) NRZI | CLOCK, 1.5u<br>RATE = 8/9; 1.69u/BIT |
| 1001000100001 ○ ○ ○ ○ | 1/2, (2,7) | CLOCK, .5u<br>RATE = 1/2; 1 u/BIT |

| | | |
|---|---|---|
| 101001001 ○ ⬭ | MFM | CLOCK, .5u<br>RATE = 1/2; 1u/BIT |
| 1 1 0 1 0 0 1 ○ ⬬ | 8/9 (0,3) NRZI | CLOCK, 1u<br>RATE = 8/9; 1.13u/BIT |
| 1001000100001 ○ ⬭ | 1/2, (2,7) | CLOCK, .33u<br>RATE = 1/2; .66 u/BIT |

| | | |
|---|---|---|
| 1011001 ○ ⬭ | 4/5 $\binom{1}{0,N}$ | CLOCK, .5u<br>RATE = 4/5; .625u/BIT |
| 1000101000001 ○ ⬭ | 1/2 $\binom{3}{1,N}$ | CLOCK, .25u<br>RATE = .5/2; .5 u/BIT |

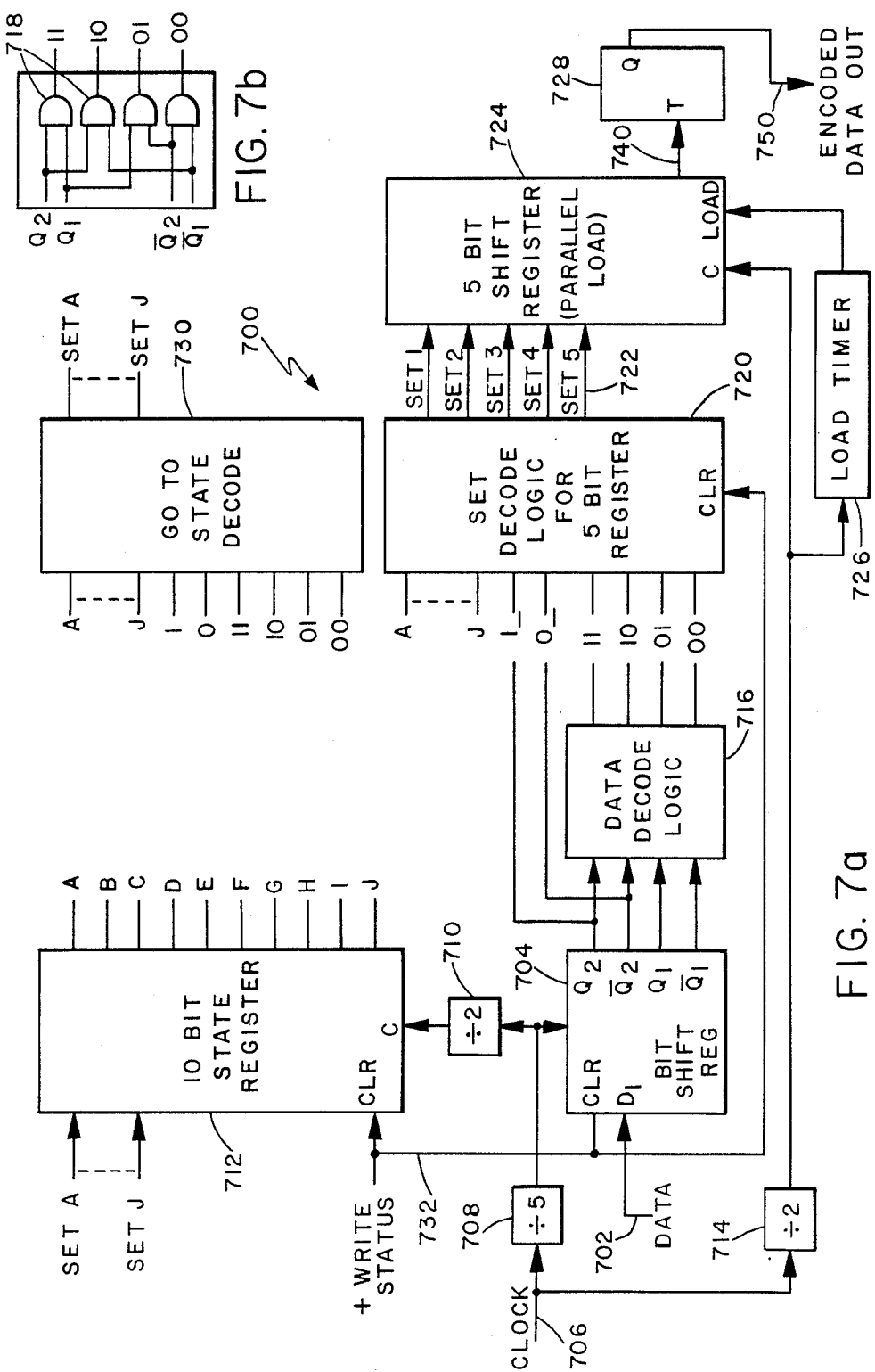

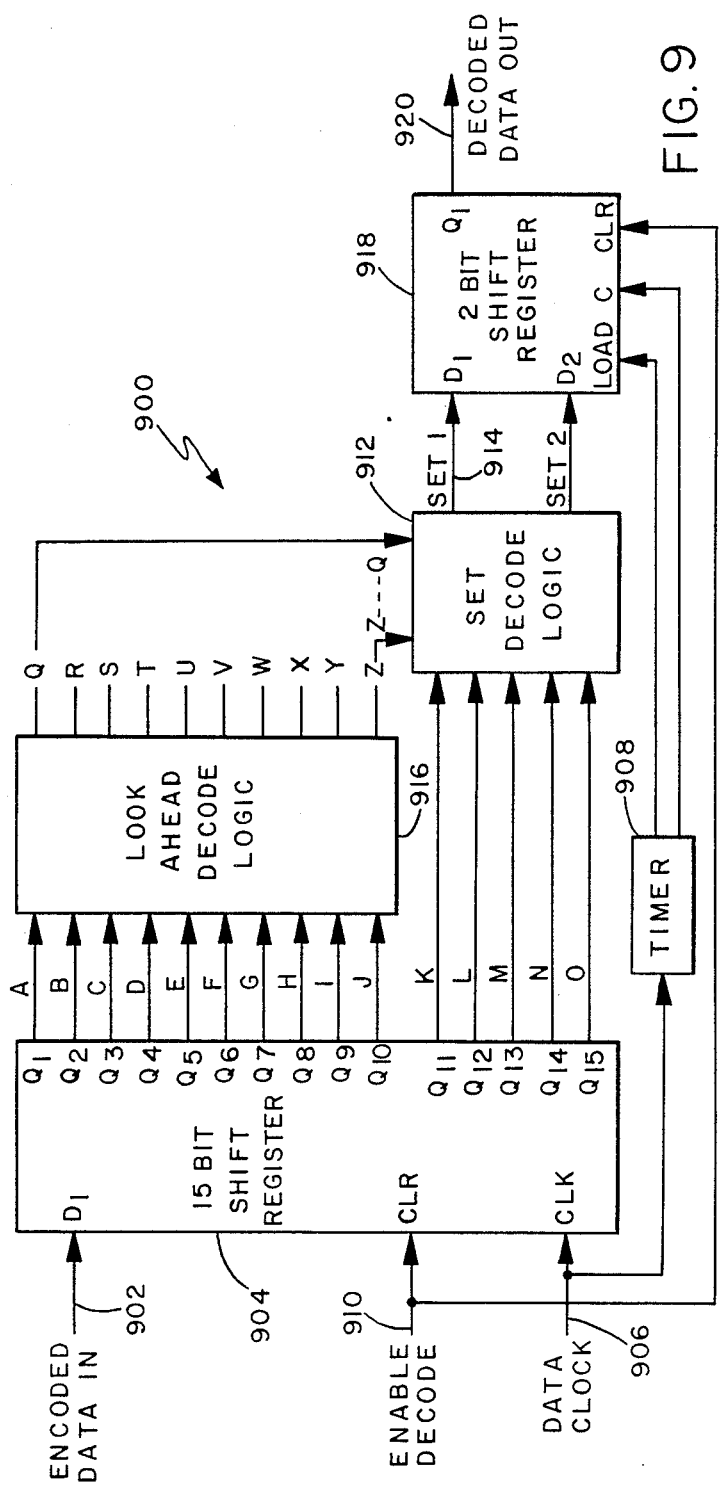

| INPUT BITS / STATE | 00 | 01 | 10 | 11 |
|---|---|---|---|---|
| A | 00000/E | 00000/D | 00001/H | 00001/I |
| B | 00000/F | 00000/D | 00001/H | 00001/I |
| C | 00000/F | 00000/G | 00001/H | 00001/I |
| D | 00101/A | 00010/H | 00100/J | 00100/H |
| E | 01001/A | 10001/A | 00001/H | 00001/I |
| F | 01001/A | 10001/A | 10010/B | 01010/B |
| G | 01000/J | 01000/H | 10100/C | 10100/D |
| H | 01000/C | 01000/D | 00100/C | 00100/D |
| I | 00000/J | 00000/H | 00010/B | 00001/A |
| J | 10000/E | 10000/D | 00010/B | 00001/A |

FIG. 10

| DECODED DATA | 00 | 01 | 10 | 11 |
|---|---|---|---|---|
| | 00000/Q | 00000/T | 00001/W | 00001/Z |
| | 01000/R | 01000/U | 00100/X | 00100/U |
| | 10000/S | 10000/V | 10010 | 01010 |
| | 01001 | 10001 | 10100/Y | 10100/V |
| | 00101 | 00010/W | 00010/Y | |

FIG. 11

$$Q = \begin{bmatrix} 0 & 0 & 0 & 0 & 1 \\ 0 & 1 & 0 & 0 & 1 \\ 0 & 1 & 0 & 1 & 0 \\ 1 & 0 & 0 & 0 & 0 \\ 1 & 0 & 0 & 0 & 1 \\ 1 & 0 & 0 & 1 & 0 \\ 0 & 0 & 1 & 0 & 0 & 0 & 0 & 0 & 0 \\ 0 & 0 & 1 & 0 & 0 & 0 & 0 & 0 & 1 \end{bmatrix}$$

$$V = \begin{bmatrix} 0 & 0 & 0 & 1 & 0 \\ 0 & 0 & 1 & 0 & 0 \\ 0 & 0 & 1 & 0 & 1 \end{bmatrix}$$

$$W = \begin{bmatrix} 0 & 0 & 1 & 0 & 0 \\ 0 & 1 & 0 & 0 & 0 \end{bmatrix}$$

$$R = \begin{bmatrix} 0 & 0 & 0 & 0 & 0 \\ 0 & 0 & 0 & 0 & 1 \\ 1 & 0 & 0 & 0 & 0 \\ 0 & 0 & 0 & 1 & 0 & 0 & 0 & 0 & 0 \\ 0 & 0 & 0 & 1 & 0 & 0 & 0 & 0 & 1 \end{bmatrix}$$

$$X = \begin{bmatrix} 0 & 0 & 0 & 0 & 0 \\ 0 & 0 & 0 & 0 & 1 \\ 1 & 0 & 0 & 0 & 0 \\ 0 & 0 & 0 & 1 & 0 & 0 & 0 & 0 & 0 \\ 0 & 0 & 0 & 1 & 0 & 0 & 0 & 0 & 1 \end{bmatrix}$$

$$S = \begin{bmatrix} 0 & 0 & 0 & 0 & 1 \\ 0 & 1 & 0 & 0 & 1 \\ 1 & 0 & 0 & 0 & 1 \end{bmatrix}$$

$$Y = \begin{bmatrix} 0 & 0 & 0 & 0 & 0 \\ 0 & 0 & 0 & 0 & 1 \end{bmatrix}$$

$$T = \begin{bmatrix} 0 & 0 & 1 & 0 & 0 \\ 0 & 0 & 1 & 0 & 1 \\ 0 & 1 & 0 & 0 & 0 \\ 1 & 0 & 1 & 0 & 0 \\ 0 & 0 & 0 & 1 & 0 & 0 & 1 & 0 & 0 \\ 0 & 0 & 0 & 1 & 0 & 0 & 0 & 1 & 0 & 0 \end{bmatrix}$$

$$Z = \begin{bmatrix} 0 & 0 & 0 & 0 & 0 \\ 0 & 0 & 0 & 1 & 0 \\ 0 & 0 & 0 & 0 & 1 \end{bmatrix}$$

$$U = \begin{bmatrix} 0 & 0 & 1 & 0 & 0 \\ 0 & 0 & 1 & 0 & 1 \\ 0 & 1 & 0 & 0 & 0 \\ 0 & 0 & 0 & 1 & 0 & 0 & 1 & 0 & 0 \\ 0 & 0 & 0 & 1 & 0 & 0 & 0 & 1 & 0 & 0 \end{bmatrix}$$

FIG. 12

| INPUT | STATE 1 | STATE 2 | STATE 3 | STATE 4 | STATE 5 |
|---|---|---|---|---|---|
| 0000 | 3/-+++ | 1/-++- | 3/+---+ | 9/++--- | 1/---+- |
| 0001 | 3/--+++ | 11/-+--- | 1/--++- | 11/++--- | 3/--+++ |
| 0010 | 3/---++ | 10/-+--- | 3/---++ | 10/+---- | 10/+++-- |
| 0011 | 3/-+--+ | 2/---+- | 2/---+- | 11/--+-- | 11/+++-- |
| 0100 | 5/---++ | 2/-++-- | 5/---++ | 10/++--- | 2/+--+- |
| 0101 | 5/--+++ | 12/-+--- | 2/--++- | 12/++--- | 5/--+++ |
| 0110 | 4/-+--+ | 9/-++-- | 4/+---+ | 9/----- | 4/+++++ |
| 0111 | 5/-+--+ | 11/----- | 5/+---+ | 11/----- | 3/+++++ |
| 1000 | 3/----+ | 10/--+-- | 3/----+ | 10/--+-- | 1/++++- |
| 1001 | 4/--+++ | 1/---+- | 1/---+- | 13/----- | 4/--+++ |
| 1010 | 4/----+ | 9/--+-- | 4/----+ | 9/--+-- | 2/++++- |
| 1011 | 5/----+ | 12/--+-- | 5/----+ | 12/--+-- | 12/+++-- |
| 1100 | 1/--++- | 10/-++-- | 3/++--+ | 10/----- | 3/+--++ |
| 1101 | 4/-++++ | 11/-++-- | 4/++--+ | 11/+---- | 4/+--++ |
| 1110 | 4/---++ | 9/-+--- | 4/---++ | 9/+---- | 9/+++-- |
| 1111 | 5/-+++ | 12/-+--- | 5/++--+ | 12/+---- | 5/+--++ |

| INPUT | STATE 6 | STATE 7 | STATE 8 | STATE 9 | STATE 10 |
|---|---|---|---|---|---|
| 0000 | 1/+--+- | 3/+---+ | 1/+--+- | 3/+---+ | 9/++--- |
| 0001 | 3/--+++ | 1/--++- | 3/--+++ | 1/+--+- | 11/++--- |
| 0010 | 10/+++-- | 3/---++ | 10/+---- | 3/++--+ | 10/+++-- |
| 0011 | 11/+++-- | 2/---+- | 11/--+-- | 3/-+--+ | 11/+++-- |
| 0100 | 2/+--+- | 5/---++ | 2/+--+- | 2/+--+- | 10/+++-- |
| 0101 | 5/--+++ | 2/--++- | 5/--+++ | 5/-+--+ | 12/++--- |
| 0110 | 8/+++++ | 4/+---+ | 9/----- | 4/+---+ | 9/-+--- |
| 0111 | 7/+++++ | 5/+---+ | 11/----- | 5/+---+ | 11/-+--- |
| 1000 | 1/++++- | 3/----+ | 10/--+-- | 1/++++- | 10/-+--- |
| 1001 | 4/--+++ | 1/---+- | 13/----- | 4/-+--+ | 12/-+--- |
| 1010 | 2/++++- | 4/----+ | 9/--+-- | 2/++++- | 9/-+--- |
| 1011 | 12/+++-- | 5/----+ | 12/--+-- | 5/++--+ | 12/+++-- |
| 1100 | 3/+--++ | 3/+--++ | 10/----- | 3/+--++ | 10/-++-- |
| 1101 | 4/+--++ | 4/+--++ | 11/+---- | 4/+--++ | 11/-++-- |
| 1110 | 9/+++-- | 4/---++ | 9/+---- | 4/++--+ | 9/+++-- |
| 1111 | 5/+--++ | 5/+--++ | 12/+---- | 5/+--++ | 12/-+--- |

| INPUT | STATE 11 | STATE 12 | STATE 13 | STATE 14 |
|---|---|---|---|---|
| 0000 | 3/-++++ | 1/-+++- | 1/-+++- | 3/-+++ |
| 0001 | 3/+++++ | 1/--++- | 1/--++- | 1/--++- |
| 0010 | 3/---++ | 10/+---- | 10/+---- | 10/+---- |
| 0011 | 11/--+-- | 2/---+- | 2/---+- | 11/--+-- |
| 0100 | 5/---++ | 2/-++-- | 2/-++-- | 2/-++-- |
| 0101 | 6/+++++ | 2/--++- | 2/--++- | 2/--++- |
| 0110 | 4/--+++ | 9/----- | 9/----- | 4/--+++ |
| 0111 | 5/--+++ | 11/----- | 14/----- | 5/--+++ |
| 1000 | 10/--+-- | 3/----+ | 3/----+ | 10/--+-- |
| 1001 | 4/+++++ | 1/---+- | 1/---+- | 4/+++++ |
| 1010 | 9/--+-- | 4/----+ | 4/----+ | 9/--+-- |
| 1011 | 12/--+-- | 5/----+ | 5/----+ | 12/--+-- |
| 1100 | 3/--+++ | 10/----- | 10/----- | 3/--+++ |
| 1101 | 4/-++++ | 11/+---- | 11/+---- | 4/-++++ |
| 1110 | 4/---++ | 9/+---- | 9/+---- | 9/+---- |
| 1111 | 5/-++++ | 12/+---- | 12/+---- | 5/-++++ |

FIG. 13

| | | |
|---|---|---|
| 1 | ST1 | P(B+C+G+H) |
| 2 | ST2 | Z(I+R) |
| 3 | ST3 | H'L'(E+J) |
| 4 | ST4 | T'U'V'W'X' |
| 5 | DA1 | COGO |
| 6 | DA2 | PO(A(B+MO)+JO(B+MO)) |
| 7 | DA3 | ZO(B(C+RO)+WO(C+RO)) |
| 8 | DA4 | HIJI(H+UI) |
| 9 | DA5 | NIOIRITI |
| 10 | I ✶ | G+E |
| 11 | J ✶ | G+H |
| 12 | K + | B(FH(EG+EG)+HI)+BCEHO |
| 13 | L + | A(CF(E+H)+CEF)+C(AG+D) |
| 14 | M + | GH+EH+AE+I |
| 15 | N + | B(C(D+I+A)+D(M+F))+B(CFJ+L) |
| 16 | O + | F(E+H)+EFH+BG |
| 17 | P + | A(K+DO)+ABL+N |
| 18 | Q + | B+AC |
| 19 | R ✶ | B+A |
| 20 | S + | A(B(EGH+EH)+BD)+GH(A+B) |
| 21 | T + | R(C(D+EH)+C(DE+G))+CDHR |
| 22 | U + | BH+FGQ |
| 23 | V + | D(HI+FG)+BFG |
| 24 | W + | GHR+DU |
| 25 | X + | F(ABH+E)+CFHR+ACV |
| 26 | Y + | EW+DEGQ+X |
| 27 | Z + | Y+T+CS |
| 28 | A'+ | AB+AC |
| 29 | B'+ | AB(H+EF)+ABEF |
| 30 | C'+ | EFH+AFGH+EG |
| 31 | D'+ | D(C(C'+R)+CGB')+ABCD |
| 32 | E'+ | G(DA'+CR)+DHIR |
| 33 | F'+ | AB+AC+CD+R |
| 34 | G'+ | AC(B+HI) |
| 35 | H'− | F(G'+J+E')+F(H(E+GR)+BCHI) |
| 36 | I'+ | DF |
| 37 | J'− | ABCGI'+GF' |
| 38 | K'+ | E(DR+BC) |
| 39 | L'− | HK'+HIA'I'+D' |
| 40 | M'+ | F+AE |
| 41 | N'+ | E(ABFH+ABJ)+EGHR |
| 42 | O'+ | D(E(AFG+GH)+EJ)+DEJ |
| 43 | P'+ | C(D(GH+J)+ADI)+D(CEGH+HI) |
| 44 | Q'+ | F(D(GH+GH)+I)+CF(EG+J) |
| 45 | R'+ | A(C+EFG+FI) |
| 46 | S'+ | AG(BCE+CDE) |
| 47 | T'− | D(BE(GH+GH)+BCFI+EFJ)+D(CR+CEFJ) |
| 48 | U'− | C(DN'+DGHM') |
| 49 | V'− | B(AQ'+CO')+B(DR'+DJM') |
| 50 | W'− | BCFSI+FHS' |

FIG. 15A

| | | |
|---|---|---|
| 51 | X' − | ACEFJ + FP' |
| 52 | Y' + | E(D(CFH+FG)+BF)+CE(HO+FJ) |
| 53 | Z' + | A(G+H)+A(EF+FI)+ER |
| 54 | AO + | H(A(EFG+FI)+ADEG+EFG)+DE(GH+FG) |
| 55 | BO + | CGH+EH+EFG+I |
| 56 | CO − | C(D(FG+Z')+BDEG)+CDEFG |
| 57 | DO + | I(C+D) |
| 58 | EO + | H(DO+EFG) |
| 59 | FO + | A(B(C+D)+EO)+A(BBO+Y') |
| 60 | GO − | CAO+CDEJ+FO |
| 61 | HO ✶ | H+F |
| 62 | IO + | A(CF(EJ+EG)+CDEH)+A(CDE+BCEH) |
| 63 | JO − | B(DO+CGHO)+B(CEGH+CIHO) |
| 64 | KO + | A(B(EH+HI)+BCFI)+AE(BF+BFH) |
| 65 | LO + | E(FH+G)+FG+J |
| 66 | MO − | DG(EF+H)+AFG |
| 67 | NO + | CD(B+LO)+CD(B+I) |
| 68 | OO + | B(AFJ+AEFH) |
| 69 | PO − | IO+KO+NO+COO |
| 70 | QO + | R+CD |
| 71 | RO − | A(B(H(F+E)+DH)+BI)+A(D(EH+GH)+BEFH) |
| 72 | SO + | B(G(C(E+F)+EF)+EFJ)+BEFJ |
| 73 | TO + | B(EHO+I) |
| 74 | UO + | D(A(H+I)+FHI)+BDEFH |
| 75 | VO + | C(DR+ADTO+UO)+CDF(E+A) |
| 76 | WO − | EGHI'+CEFH |
| 77 | XO + | A(BSI+BDEH)+ACFG |
| 78 | YO + | JQO(EF+EF)+XO |
| 79 | ZO − | YO+VO+ASO |
| 80 | AI + | A(C(GH+EH)+BCEH)+A(CDGH+BCEG) |
| 81 | BI + | AC(BEJ+DEG)+C(BEJ+BEG) |
| 82 | CI + | ABC(FH+FH) |
| 83 | DI + | A(BEH+BDEG)+EGH |
| 84 | EI + | J(AC+DE) |
| 85 | FI + | GR |
| 86 | GI + | F(UI+EI+BI)+F(AI+DI+CFI) |
| 87 | HI − | BD(AC+AHI)+CDR |
| 88 | II + | CDEHO+BCEGH |
| 89 | JI − | ACD+DECI+II+GI |
| 90 | KI + | GH+F+E |
| 91 | LI + | H(A(CG+CDI)+ACDE)+ABCH |
| 92 | MI + | D(AFGH+AB)+D(EHO+FG) |
| 93 | NI − | A(B(EFH+FI)+BEHO)+ABCFG |
| 94 | OI − | D(A(HI+C)+B(I+H))+D(ACHI+ABKI) |
| 95 | PI + | SI+DKI |
| 96 | QI + | A(BFGH+BJ) |
| 97 | RI − | CD(B+EJ)+C(BPI+EQI) |
| 98 | SI + | HI |
| 99 | TI − | FLI+ACDFSI+CMI |
| 100 | UI ✶ | I(CR+BD) |

FIG. 15B

| a b | c d e f g | A1 | A2 | B3 | B4 | B5 | C9 | C10 | C11 | C12 | D37 | D48 |
|---|---|---|---|---|---|---|---|---|---|---|---|---|
| . . | + + + + − | 8 | 10 | | | | | | | | | |
| . . | − + + + − | 0 | 4 | | | | | | | | | |
| . . | − − − + − | 9 | 3 | | | | | | | | | |
| . + | + − − + − | 0 | 4 | | | | | | | | | |
| . − | + − − + − | 1 | 4 | | | | | | | | | |
| . + | − − + + − | 1 | 5 | | | | | | | | | |
| − − | − − + + − | 1 | 5 | | | | | | | | | |
| + − | − − + + − | 12 | 12 | | | | | | | | | |
| . . | + − − + + | | | 12 | 13 | 15 | | | | | | |
| . . | − + + + + | | | 0 | 13 | 15 | | | | | | |
| . . | − − − + + | | | 2 | 14 | 4 | | | | | | |
| . . | − − − − + | | | 8 | 10 | 11 | | | | | | |
| . . | + − − − + | | | 0 | 6 | 7 | | | | | | |
| . − | + + + + + | | | 1 | 9 | 5 | | | | | | |
| . + | + + + + + | | | | | | | | | | 7 | 6 |
| + − | − + − − + | | | 3 | 6 | 7 | | | | | | |
| − − | − + − − + | | | 3 | 9 | 5 | | | | | | |
| − − | − − + + + | | | 12 | 6 | 7 | | | | | | |
| . + | − − + + + | | | 1 | 9 | 5 | | | | | | |
| + − | − − + + + | | | 1 | 9 | 5 | | | | | | |
| . + | + + − − + | | | 12 | 13 | 15 | | | | | | |
| . − | + + − − + | | | 2 | 14 | 11 | | | | | | |
| . . | + − − − − | | | | | | 14 | 2 | 13 | 15 | | |
| . . | − + + − − | | | | | | 6 | 12 | 13 | 15 | | |
| . . | − − + − − | | | | | | 10 | 8 | 3 | 11 | | |
| . . | + + + − − | | | | | | 14 | 2 | 3 | 11 | | |
| . . | + + − − − | | | | | | 0 | 4 | 1 | 5 | | |
| . + | − − − − − | | | | | | 6 | 12 | 7 | 9 | | |
| . − | − − − − − | | | | | | 6 | 12 | 7 | 5 | | |
| + − | − + − − − | | | | | | 14 | 2 | 1 | 5 | | |
| − − | − + − − − | | | | | | 10 | 8 | 7 | 9 | | |

| h i j k l | A | B | C | D |
|---|---|---|---|---|
| − − − − − | A2 | B4 | C12 | D48 |
| − − − − + | A1 | B3 | C12 | D37 |
| − − − + − | A2 | B3 | C12 | D37 |
| − − − + + | A1 | B3 | C11 | D37 |
| − − + − − | A2 | B4 | C11 | D48 |
| − − + + − | A1 | B3 | C12 | D37 |
| − − + + + | A1 | B5 | C11 | D48 |
| − + − − − | A2 | B4 | C10 | D48 |
| − + − − + | A1 | B3 | C9 | D37 |
| − + + − − | A2 | B4 | C10 | D48 |
| − + + + − | A2 | B3 | C12 | D37 |
| − + + + + | A1 | B5 | C11 | D48 |
| + − − − − | A2 | B4 | C12 | D48 |
| + − − − + | A1 | B3 | C9 | D37 |
| + − − + − | A2 | B5 | C9 | D48 |
| + − − + + | A1 | B5 | C9 | D37 |
| + + − − − | A2 | B4 | C10 | D48 |
| + + − − + | A1 | B3 | C9 | D37 |
| + + + − − | A2 | B5 | C10 | D48 |
| + + + + − | A2 | B5 | C9 | D48 |
| + + + + + | A1 | B5 | C11 | D48 |

FIG. 16

$A1 = Y5 + \underline{Y2}\,Y3\,Y4$ $A2 = \underline{A1}$ $B3 = \underline{Y4}\,Y5 + \underline{Y1}\,Y3\,Y4 + \underline{Y1}\,Y4\,\underline{Y5}$ $B4 = Y3\,\underline{Y4}\,Y5 + \underline{Y1}\,Y4\,\underline{Y5}$ $B5 = Y1\,Y3 + Y1\,Y4 + Y3\,Y5$ $C9 = Y1\,Y4\,\underline{Y5} + Y1\,\underline{Y3}\,Y5 + Y2\,\underline{Y3}\,Y5$ $C10 = Y2\,\underline{Y4}\,Y5$ $C11 = Y3\,Y5 + \underline{Y1}\,Y4\,Y5 + \underline{Y2}\,Y3\,\underline{Y4}$ $C12 = \underline{Y1}\,Y4\,\underline{Y5} + \underline{Y1}\,Y2\,Y3\,\underline{Y4} + Y2\,\underline{Y3}\,\underline{Y4}\,Y5$ $D37 = \underline{Y3}\,Y5 + \underline{Y1}\,Y4\,\underline{Y5}$ $D48 = \underline{D37}$ $Z1 = (X4\,\underline{X5}(W4\,\underline{W5}\,\underline{X2}\,X3 + \underline{X1}\,\underline{X2} + \underline{X1}\,\underline{X2}\,X3\,A1)$
$\qquad + \underline{X4}\,\underline{X5}(C9(\underline{X2}\,X3 + X1\,\underline{X2} + X1\,\underline{X2}\,X3 + X1\,X2\,X3)$
$\qquad\qquad + C10(\underline{X1}\,\underline{X2} + \underline{X1}\,X3 + \underline{W4}\,\underline{X1})$
$\qquad\qquad + C11(\underline{X1}\,X2\,X3 + X1\,\underline{X2})$
$\qquad\qquad + C12(\underline{X1}\,X2 + X3 + \underline{W5}\,\underline{X1} + \underline{W4}\,\underline{X1}\,X2))$
$\qquad + X5(B3(\underline{X1}\,X2\,\underline{X4} + \underline{W5}\,X2\,\underline{X3} + X1\,\underline{X2}\,X4 + \underline{W4}\,\underline{W5}\,X2\,X3)$
$\qquad\qquad + B4(\underline{X1}\,X2\,\underline{X3} + \underline{W4}\,\underline{W5}\,\underline{X2} + \underline{X3}\,X4 + X1\,\underline{X2}\,\underline{X3} + \underline{W4}\,\underline{W5}\,\underline{X3} + \underline{W5}\,\underline{X1}\,X3)$
$\qquad\qquad + B5(\underline{X1}\,X2\,\underline{X4} + X1\,X2\,\underline{X4} + \underline{X1}\,\underline{X2}\,X3 + X1\,X2\,\underline{X3})))$ $Z2 = (X4\,\underline{X5}(W4\,\underline{W5}\,\underline{X1}\,\underline{X2}\,X3 + A2(\underline{X1}\,X3 + X1\,\underline{X2}))$
$\qquad + \underline{X4}\,\underline{X5}(C9(\underline{X2}\,X3 + X2\,X3 + \underline{W4}\,\underline{X1}\,X2)$
$\qquad\qquad + C10(\underline{X1}\,X2\,X3 + \underline{X1}\,X2\,X3 + X1\,X2\,\underline{X3})$
$\qquad\qquad + C11(\underline{X1}\,X2\,X3 + \underline{X1}\,X2\,X3 + \underline{W4}\,\underline{X1}\,X2 + X1\,\underline{X2})$
$\qquad\qquad + C12(\underline{X1}\,X2\,X3 + X1\,X3 + \underline{W4}\,X2\,X3 + \underline{W5}\,X2\,X3))$
$\qquad + X5(B3(\underline{W5}\,X2\,\underline{X3}\,X4 + \underline{X1}\,X2\,\underline{X4} + \underline{W4}\,\underline{W5}\,\underline{X2}\,X3)$
$\qquad\qquad + B4(\underline{X1}\,\underline{X4} + \underline{W4}\,X2\,\underline{X4} + \underline{X2}\,\underline{X3}\,X4 + \underline{X1}\,X2\,\underline{X3} + \underline{W4}\,\underline{W5}\,\underline{X1}\,X4)$
$\qquad\qquad + B5(\underline{X1}\,X4 + X1\,\underline{X2} + \underline{W5}\,X4 + \underline{X1}\,X2\,\underline{X3} + \underline{W5}\,X2\,\underline{X4})$
$\qquad\qquad + \underline{W5}\,X1\,X2\,X3\,X4))$ $Z3 = (X4\,\underline{X5}(A2(\underline{X1}\,\underline{X2}\,X3 + X1\,X2\,X3))$
$\qquad + \underline{X4}\,\underline{X5}(C9(\underline{X1}\,X2\,X3)$
$\qquad\qquad + C10(X1\,\underline{X2} + X1\,X3 + \underline{W4}\,\underline{X1}\,X2\,\underline{X3})$
$\qquad\qquad + C11(\underline{X1}\,\underline{X2} + X1\,X3 + \underline{W4}\,\underline{X1}\,X3)$
$\qquad\qquad + C12(X3 + X1\,\underline{X2} + \underline{W5}\,X2))$
$\qquad + X5(B3(\underline{W5}\,X2\,\underline{X3} + \underline{X1}\,X2\,\underline{X3}\,X4)$
$\qquad\qquad + B4(\underline{X1}\,X2\,\underline{X3} + \underline{W4}\,\underline{W5}\,\underline{X1}\,\underline{X2} + X2\,\underline{X4} + \underline{W4}\,\underline{W5}\,X4 + \underline{W4}\,\underline{W5}\,\underline{X1}\,X4)$
$\qquad\qquad + B5(\underline{X2}\,\underline{X4} + X1\,\underline{X3} + \underline{W4}\,\underline{W5}\,\underline{X4} + \underline{X1}\,X2\,X3 + \underline{W4}\,\underline{W5}\,\underline{X1}\,X3)$
$\qquad\qquad + \underline{W5}\,X1\,X2\,X3\,X4))$ $Z4 = (X4\,\underline{X5}(\underline{W5}\,\underline{X1}\,X2 + \underline{W4}\,\underline{X1}\,X2 + \underline{X1}\,\underline{X2}\,X3 + A1\,\underline{W5}\,X3)$
$\qquad + \underline{X4}\,\underline{X5}(C11 + C12)$
$\qquad + X5(B3(\underline{X1}\,X2\,\underline{X3} + \underline{W5}\,\underline{X1}\,X2\,X3 + \underline{W4}\,\underline{X1}\,X2\,X3 + \underline{W5}\,\underline{X1}\,X2\,X3)$
$\qquad\qquad + B4(\underline{W5}\,X2\,\underline{X4} + \underline{W4}\,\underline{X1}\,X2 + \underline{W5}\,X2\,X3 + X1\,\underline{X2}\,X4 + \underline{W4}\,\underline{X1}\,X2\,X3 + \underline{W5}\,\underline{X1}\,X2\,X3)$
$\qquad\qquad + B5(\underline{X4} + \underline{X1}\,X3 + X1\,X2 + \underline{W5}\,X1)$
$\qquad\qquad + D37\,\underline{W5}\,X1\,X2\,X3\,X4))$

FIG. 18

METHOD AND APPARATUS FOR ASYMMETRICAL RLL CODING

CROSS REFERENCE TO RELATED APPLICATIONS

This application is a Continuation-in-Part of the U.S. patent application Ser. No. 874,041 filed on June 13, 1986, entitled "ASYMMETRICAL RLL CODING", now abandoned.

FIELD OF THE INVENTION

The present invention relates to apparatus for encoding data and more particularly to a method and an apparatus for generating a string of asymmetrically run-length-limited encoded data bits from a string of input data bits. The invention further relates to optical storage media and a method for increasing the linear recording density of data recorded thereon for run-length-limited data constraints.

BACKGROUND

In the past, the computer industry has relied extensively on magnetic media in many forms, such as 8 or 5 ¼ inch diskettes or hard disk platters, for data and information storage. This magnetic media storage involves using specialized recording elements or heads positioned adjacent to the media to create magnetic fields that penetrate the media surface and alter the orientation of magnetic fields resident in the media. Using this technique, data is recorded as the leading edge of a series of north/south or south/north transitions in the media.

Magnetic media are generally organized into a series of adjacent "tracks" which are further subdivided into predetermined patterns such as sectors and clusters. Predefined formats of a certain number of tracks per inch on a medium and a certain number of magnetic transitions per track allows a storage system to maintain synchronous control and reliability in data transfer to and from the medium. To increase the linear recording density of data storage within a track, the number of transitions per track can be increased. This has been successful especially with newly developed media which have higher magnetic retention values and increased magnetic field resistance laterally across the tracks. Within a given track, timing techniques make it possible to obtain transition spacings on the order of 1 micron or less. However, magnetic media have larger track-to-track dimensional and density limitations. This is due to the inability to position read/write apparatus used to exchange data between a magnetic medium and an associated data system relative to inter-track dimensions of several microns or less.

As an alternative, optical means of data storage are being developed. Optical data storage is appealing because optical systems can operate at higher media addressing speeds, greater bandwidths, and smaller track-to-track dimensions as compared to magnetic media. These features are possible because finely focused light is used and can be optically manipulated to smaller dimensions than magnetic read/write apparatus. Small diffraction limited lasers can be positioned laterally across data storage tracks with 1 to 2 micron dimensions. However, optical systems impose new constraints on linear recording density.

For any optically based read/write system the minimum spot size of the light or optical beam on the media must be accounted for. This spot size turns out to be significantly larger than for a magnetic transition and reduces linear recording density. A typical diffraction-limited laser provides a focal or waist size on the order of 1 to 2 microns. An optical system must also provide sufficient (additional) adjacent storage media to resolve between adjacent write patterns left by a laser. At the same time, the minimum pattern size is enhanced by the recording techniques used for optical data storage, which differ from magnetic media.

In optical data storage the data is recorded in terms of features or surface effects created by a laser beam spot (the "write beam") on the media. These surface effects create generally circular patterns that can have many topologies including "bubbles", bumps, pits, and holes. Presently, optical data storage can be divided into two basic classes, the first being material removal and the second being state alteration. For surface removal, the laser energy is used to actually remove material from the media so as to effect a different surface reflectivity or transmissivity. Materials such as thin metallic films on various substrates fall into this class. The state alteration technique uses the laser energy to alter a state or property of the optical media. This includes phase transitions such as amorphous/crystalline transitions, electro-optic effects, or chemical state changes. The more preferred method of state alteration involves an electro-optical state change. By altering the electro-optical properties of a media, the polarization of an incident laser "read beam" is shifted or rotated and the change of polarization detected accordingly.

The regions of altered state can be thought of as circular marks on the optical media. Decreasing mark separation to increase the number of marks per track would seem to obtain higher linear recording density for optically stored data. However, certain inherent limitations are reached very quickly. This can be illustrated using the optical data recording patterns shown in FIG. 1.

For a single mark, high resolution output is obtained whenever the laser beam used for reading marks (the "read beam") aligns itself precisely with a mark. For two adjacent marks high resolution output is obtained when the read beam is well aligned with each mark in sequence. In FIG. 1 a series of adjacent optical marks 10, 12, and 14 are illustrated positioned on an optical media 20 and separated by "non-mark" regions 16 and 18 respectively. The nominal size for a mark is assumed to be 1 micron, the size of a typical write beam. In the case of the first two marks, 10 and 12, mark separation is slightly greater than 1 micron and a read beam will be totally reflected or diffracted by the non-mark region as shown by the dotted outline 16. However, the two marks 12 and 14 are positioned less than micron apart which results in overlap into the mark regions for a read beam reading the non-mark region as shown by dotted line 18. In this case, the detection system begins to lose resolution between the mark and non-mark regions and can erroneously conclude that it is in a mark region. Also the read system begins to lose resolution between the adjacent marks 12 and 14. This is analogous to loss of intersymbol resolution in magnetic media.

Another factor affecting linear recording density in optical media is the selection of a data coding scheme. Pulse-width modulation (PWM) and run-length-limited (RLL) coding are the most commonly employed techniques, having been developed for magnetic data storage. When applied to optical media, the PWM coding employs leading and trailing edge detection of a mark, along with changes in mark sizes, to record data and decrease the number of discrete marks. An RLL encoding scheme encodes data into unique strings of data bits to increase channel data density and decrease data error propagation.

While both of these techniques serve certain advantageous functions, they limit the linear recording density in optical storage media by employing, on average, equal mark and non-mark minimum dimensions. This leaves a fairly large surface area of the optical media unused and creates a natural limit to the linear recording density.

Therefore, what is needed to improve the linear recording density for data recorded on optical storage media is a new method of decreasing the average non-mark area without substantial loss of intersymbol resolution. It would also be an advance in the art to be able to provide improved linear recording density with limited data error propagation.

SUMMARY OF THE INVENTION

It is a purpose of the present invention to generate encoded data for storage onto optical media which allows for increased linear recording density.

It is another purpose of this invention to provide an apparatus for realizing new types of data encoding for use on optical media.

These and other purposes, advantages, and objects of the present invention are realized by utilizing a new type of data encoding method defined as an asymmetric run-length-limited constraint.

The present invention embodies a method for encoding an unconstrained string of data bits according to a run-length-limited encoding constraint in the form of M/N (d,k), where M is the number of input data bits, N is the number of data bits produced in response to the M input data bits, d is the minimum number of 0's between adjacent 1's in the encoded data string, and k is the maximum number of 0's between the adjacent 1's in the encoded string. In the invention, each 1 in the encoded data string alters the (d,k) constraint. According to the invention, the (d,k) constraint alternates between a value $(d_1,k_1)$ and a value $(d_2,k_2)$ in response to adjacent coded 1's. In the invention, $d_1 \neq d_2$.

In this manner, the amount of space allocated for 0's recorded between 1's is changed so that within a PWM mark the coding has one coding value and between adjacent marks the minimum 0 count of the coding value is lower. Therefore, the present invention advances the art by establishing a new constraint which allows the non-mark regions to consume less area than the mark regions and thus greatly increases linear recording density for optically stored data.

The asymmetrical coding constraints can be implemented either on nonprocessed input data strings or data strings previously encoded using a conventional symmetrical RLL technique.

In one aspect of the invention, an apparatus is provided for generating asymmetrically encoded data from a previously symmetrically RLL-encoded data string, which employs at least one means for generating a single pulse of variable width in response to a negative-going transition in the input data string, coupled to means for combining the input data string and pulses from the means for generating a single pulse. This produces an output data string having positive transitions that are substantially in phase with the corresponding positive transitions in the input data string and having negative transitions that are delayed in phase with corresponding negative transitions in the input data string by an amount based upon the width of the pulses from the means for generating a single pulse.

The pulse duration can be a fractional value of the data clock pulse. The pulse width can be so varied, or more than one single pulse means and combining means employed, so as to provide multiple asymmetric encoding constraints.

In a further aspect of this embodiment, an apparatus is provided for generating symmetrically encoded data from a previously asymmetrically run-length-limited encoded input data. The decoding apparatus employs at least one means for generating a single pulse of variable width in response to a positive-going transition in the input data string; means for inverting the pulses produced by the single pulse means; and combining means responsive to the RLL encoded input data string and pulses from the inverting means. This produces an output data string having negative transitions that are substantially in phase with corresponding negative transitions in said input data string and having positive transitions that are delayed in phase by an amount based upon the width of said pulses from said means for generating a single pulse.

In a further aspect of the present invention, an apparatus is provided for generating an asymmetrically encoded data string from an unencoded input data string at an M/N rate, having the code constraint M/N $(d_1,k_1);(d_2,k_2)$. The encoding apparatus employs shift register means for receiving the input data string and state means for defining a sequence of predetermined states for the apparatus, each state of each sequence allowing the encoding of M bits of input data to a predetermined N bits of asymmetrically encoded output data according to the coding constraint corresponding to that sequence. A set logic means detects a current pattern of M data bits in the shift register means and provides an output set of N bits in response both to the current pattern and a current state defined by the state means. A selection means chooses a next state of a sequence in response to the set of N bits provided by the set logic means and the current state defined by the state means, based on the predetermined value of $d_x$ and $k_y$ for the current state, the selection means being coupled to the state means so as to shift the state means to the next state.

In yet another aspect of the invention, an apparatus is provided for generating an unencoded data string from an asymmetric run-length-limited encoded input data string at an N/M rate, where the run-length-limited encoded input data follows a M/N $(d_1,k_1);(d_2,k_2)$ coding constraint. The decoding apparatus employs shift register means for receiving a predetermined number of data bits in the encoded input data string, the predetermined number being greater than N; and look ahead means for detecting a pattern in every N data bits present in the input data string and comparing the pattern with pre-defined sequences of data bit patterns and generating a signal indicative of the pre-defined bit pattern. Set decode logic means provides M output data bits for every N bits of input data in response to the generated signal from the look ahead means and the data bits present in the shift register means based on the predetermined values of $d_x$ and $k_y$ for the coding constraint and the predetermined combinations of allowed data bit patterns.

BRIEF DESCRIPTION OF THE DRAWINGS

The novel features of the present invention may be better understood from the accompanying description when taken in conjunction with the accompanying drawings in which like characters refer to like parts and in which:

FIG. 2 illustrates physical patterns created on optical storage media by several representative data encoding schemes with:

FIG. 3b illustrates pulse waveforms associated with the encoder of FIG. 3a;

FIG. 4b illustrates pulse waveforms associated with the decoder of FIG. 4a;

FIG. 7a illustrates a third asymmetric encoder according to the present invention for accepting raw data and encoding with an RLL 2/5(1,9)–(4,9) constraint;

FIG. 7b illustrates exemplary decode logic for use in the encoder of FIG. 7;

FIG. 8 illustrates the data input and data output for the encoder of FIG. 7;

FIG. 9 illustrates a third asymmetric decoder according to the present invention for accepting data encoded with a RLL 2/5(1,9)–(4,9) constraint;

FIG. 10 is an encode table for the encoder of FIG. 7a;

FIG. 11 is a decode table for the decoder of FIG. 9;

FIG. 12 is a look-ahead decode table for the decoder of FIG. 9.

FIG. 13 is an encode table for a 4/5 (1,11)–(0,10) asymmetrical RLL code.

FIG. 15 is a listing of Boolean terms suitable for implementing the encoder of FIG. 14 in discrete logic.

FIG. 16 is a decoding table for decoding strings encoded according to the encoding table of FIG. 13.

FIG. 18 is a listing of Boolean expressions illustrative of a discrete-logic decoder which operates according to the decoding table of FIG. 16.

DETAILED DESCRIPTION OF PREFERRED EMBODIMENTS

Figures 1, 2A, 2B, 2C:
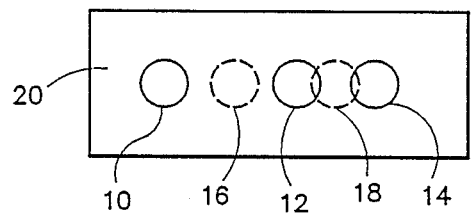
FIG. 1 illustrates physical patterns created on optical storage media by representative data marks.
FIG. 2a illustrating patterns for symmetrically PPM encoded data.
FIG. 2b illustrating patterns for symmetrically PWM encoded data.
FIG. 2c illustrating patterns for asymmetrically encoded data according to the present invention.

The present invention comprises apparatus and a method for realizing an improved linear recording density of data onto optical storage media. Data in the form of a serialized string of data bits is subjected to an encoding process, prior to storage on the optical media, that creates an asymmetric pattern between adjacent mark and non-mark recording areas. This is accomplished by an apparatus that accepts previously run-length-limited (RLL) encoded data and adds a new coding constraint, or accepts unencoded, unconstrained data and encodes it using a new coding constraint, which creates an alternating coding relationship between every other data bit 1. This new coding technique provides a physically asymmetric relationship for the encoded data recorded onto optical media which can be optimized to decrease unused data storage area linearly along a given recording track.

In the description which follows, it is assumed that the unencoded data comprises information in conventional electrical format. The unencoded alphabet is binary including a "1" and "0". The unencoded data are referred to as "bits". Since the encoding assumes transfer between a processing medium having one information format and a recording medium having another format, the encoded information units are called, preferably, "characters", or, occasionally, "bits". In the prior art, encoding and decoding are performed on units called "symbols" (or "blocks", or "words"). Symbols are units which embrace one or more adjacent characters in an unencoded character string.

As previously discussed, conventional read/write apparatus for optical data storage employ a finely focused optical beam preferably generated by a small laser source such as a diode laser. The laser is focused to a predetermined spot size on the optical media where it alters the reflective or refractive properties of the media within the focal spot. The alteration can take many forms from material removal to phase or state transitions.

A preferred technique for proposed optical data storage systems employs electro-optical effects to affect a localized change in the state of the media. In this technique, a polarized laser write beam is used to deposit energy within a circular focal spot on the media and alter its optical refractive properties. Laser light subsequently reflected from the focal spot on the media is polarization rotated. The resulting feature or pattern of state alteration can be generally described or thought of as a circular "mark" of polarization rotation. Therefore, the term mark is used below to denote the pattern placed on the optical media during recording or writing.

In order to obtain high data recording densities, it is desirable to utilize the smallest possible focal spot thereby using a small mark to record information. There are many factors such as reading resolution, power requirements, optical element aberrations, and laser media characteristics, that all combine to limit the mark size obtainable. However, even for a nearly diffraction-limited laser output in a typical commercial apparatus the focal point on the optical media is on the order of 1 to 2 microns in diameter.

In reading or writing data, optical data storage systems employ either mark edge or center position detection schemes, depending upon encoding constraints and applications. Center position detection relies on detecting a substantial portion of the effect caused by the mark on a laser read beam during a data clock cycle. Edge detection is sensitive to a change of value in the laser beam above or below a certain predetermined minimum threshold.

Within these approaches are two major variations for encoding data onto optical media. The first is referred to as pulse-pulse or pulse-position modulation (PPM). In this technique, data is recorded and detected by defining a mark as a data bit 1 and "non-mark" as a data bit 0.

Alternately, the data can be recorded by defining the trailing and leading edges of a mark as a data bit 1 and making the mark larger or smaller depending upon how many 0's are positioned between the 1's. In this mode, the writing laser continues to pulse at regular mark intervals, dependent upon write circuitry timing, until the final mark area (length) is obtained. Pulsing as opposed to a continuous mode is used to avoid beam blooming and energy deposition problems. This technique is commonly referred to as pulse-width-modulation (PWM).

In addition to physical modulation of mark position or size during the string recording, there are modulation and encoding techniques employed which affect mark placement or size. That is, there are several alternative schemes, such as NRZI (Non Return to Zero (I)), for interpreting the presence of a 1 or 0 digital states and incorporating this information in a pulse train. There are also encoding schemes such as MFM (Modified Frequency Modulation), typically run-length-limited, employed to increase data channel density. While these modulation and coding schemes are apparent to those skilled in the art, they are mentioned here for a more complete understanding of the following examples.

A listing of input data and the resulting marks recorded under several encoding schemes using PPM recording is illustrated in FIG. 2a and using PWM recording in FIG. 2b, along with the data modulation scheme designator (NRZI, etc.). For FIG. 2, it is assumed that the minimum mark size is 1 micron (u) and the minimum spacing between mark centers is 1.5 microns, for adequate resolution. From these values a clocking rate and thus data density can be computed and are shown for each recording scheme. Notice that PWM schemes provide increased density, improving the linear recording density in optical storage media.

While it can be seen that PWM improves the recording density, there is still wasted space between the now-elongated marks that it is desirable to reduce. Physically what is desired is an encoding technique that shrinks the area between marks so that a minimum area of media is left. This greatly increases density since the area within recording marks can be decreased by several encoding-/recording techniques.

As with magnetic media, several coding schemes can be applied to the data prior to writing to the media in order to improve data density and reliability. The most useful coding technique used is run-length-limited (RLL) encoding whereby a given set of data bits M are encoded into a new set of encoded bits N prior to recording. This greatly improves the data transfer rate and channel density, even though the number of bits M encoded is generally less than the number of bits N in the resultant encoded string (i.e., not a 1:1 correspondence).

Examples of RLL coding techniques are disclosed in U.S. Pat. Nos. 3,589,899 issued Sept. 5, 1972 or 4,488,142 issued Dec. 11, 1984, both to P.A. Franaszek, and U.S. Pat. No. 4,413,251 issued Nov. 1, 1983 to R. L. Adler et al.

The RLL schemes typically employed require a minimum number (d) of 0's between 1's up to a maximum number (k). The value of k is determined by the timing requirements and clock/data synchronization. Therefore, a common code used is 1/2 (2,7) which encodes one data bit into 2 encoded bits and requires at least two but no more than seven 0's between adjacent 1's. In the case of magnetic media, a minimum zero count is also used to assure minimum inter symbol resolution.

However, even though the overall density of data in a channel transferring data bits to optical media is increased by RLL encoding, the linear recording density is only slightly improved This is true because (d,k) type RLL encoding is symmetrical, that is, if at least 1, 2, or more zeros are used within a mark region, then the same minimum and maximum (d,k) is also applied to the non-mark region. Thus, the minimum spacing of marks is fixed at (d+1) times the mark size and on the average may be much larger.

The present invention presents a method for monitoring the data string to be encoded and changing the d and k constraints based upon the even or oddness of the data bit 1 detected. That is, every other 1 data bit alters the encoding constraints. In this manner, the amount of space allocated for 0's recorded between 1's is changed so that within a PWM mark the coding has a previously typical coding value and between adjacent marks the minimum coding value is smaller. Therefore, on the average the non-mark regions are smaller than the mark regions for a minimum data string and space between marks is decreased. This results in an increase in the linear recording density.

The following diagram describes the RLL (2,7) code constraints. It has eight constraint states, $S_0$–$S_7$. Each authorized transition from one constraint state to another is indicated by an arrow labeled either 0 or 1. The sequence of labels encountered when following any path through this diagram satisfies the RLL (2,7) constraints, that is, the number of 0's between successive 1's is at least 2 and, at most, 7. Conversely, every sequence which satisfies the RLL (2,7) constraints corresponds to a particular path in the diagram.

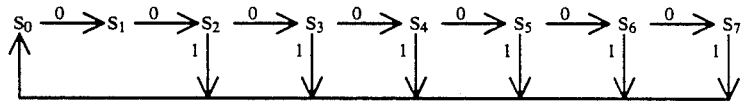

A rate M/N encoder can be derived from the code constraint diagram. Such an encoder can be fully described by a similar diagram in which each constraint state has exactly 2M arrows pointing outwardly from it. These arrows would be labeled with N-bit blocks of 0's and 1's in such a way that the sequence created by concatenating the labels encountered along any path in the encoder diagram would satisfy the run-length-constraints.

Exemplary circuit and design characteristics for realizing the constraints and status in RLL (d,k,) type encoders, especially the (2,7) type, can be found in U.S. Pat. Nos. 3,689,899, 4,488,142, or 4,413,251 discussed above.

As previously noted, an RLL (d,k) coding scheme may provide an initial advantage for data density in magnetic media, but has a disadvantage associated with its implementation in optical media. The reason is that the coding still assumes that, for all incoming data, the spacing between adjacent data bit 1's is to be treated the same for all 1's. Thus, although the recording technique improves density by utilizing both leading and trailing mark edges, it assumes that non-mark regions between 1's should be constrained the same as mark regions. That is, the same minimum and maximum spacing constraints will apply, since the same code constraints apply between all adjacent 1's. Physically this translates to a minimum spacing between marks that will have the same size as the minimum length of a mark.

This automatic requirement for using the same area constraints between all marks can be tolerated in magnetic media, but it consumes excessive area in optical media. The present invention advances the art by establishing a new constraint which allows the non-mark regions to consume less area than the mark regions and thus greatly increases linear recording density for optically stored data.

What the present invention provides is a new class of codes or coding schemes which deviates from the linearly uniform or symmetrical coding approach. Instead, a new asymmetric code is created that treats adjacent 1's differently dependent upon their position in a string of data bits.

The new coding scheme of the present invention establishes a different (d,k) type constraint for the separation between adjacent ones by alternating between two values of d. This means that first the code assumes a value $(d_1,k_1)$ and then a value $(d_2,k_2)$. The new coding constraints can be expressed in several ways but the following expressions are considered to be most amenable to use and easily understood:

Old: $M/N (d,k)$

New: $M/N (d_1/d_2,k)$ $M/N (d_1,k_1) - (d_2,k_2)$ $M/N (d_2,k_1) - (d_1,k_2)$ $M/N (d_1,k_1); (d_2,k_2)$

In general, $K_1=K_2$ is preferred since an increase in the maximum size of k may allow the coding function to have clock synchronization and data bit error propagation problems. Smaller values of k may truncate the data string excessively and require a more complex encoder/decoder to prevent loss of information. However, in some applications increasing k is permissible.

The constraints of an asymmetric RLL code with parameter values (3,7);(1,7) are illustrated by the following constraint state transition diagram. In the upper row, constraint states $S_0$–$S_7$, force at least three, and at most, seven 0's between adjacent 1's. In the lower row, constraint states $S_8$–$S_{15}$ force at least one, and at most, seven 0's between adjacent 1's. The upper and lower rows are interconnected in such a way that the (3,7) and (1,7) constraints are applied to alternate runs of 0's in response to adjacent 1's. The sequence labels encountered when following any path through this diagram satisfies the asymmetric (3,7);(1,7) constraints, and every sequence which satisfies the asymmetric (3,7);(1,7) constraints corresponds to a path in the diagram.

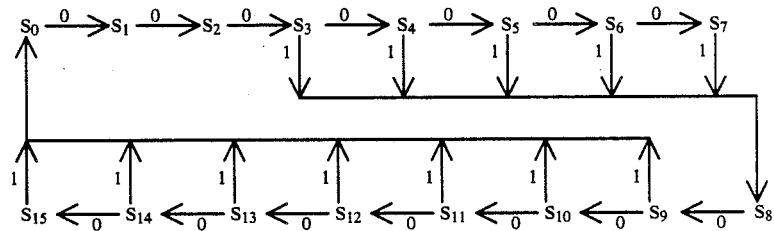

The asymmetric code constraint diagram provides a starting point for the construction of a rate M/N encoder. Such an encoder can be described by a similar diagram in which each constraint state has exactly 2M arrows pointing outward from it. These arrows would be labeled with M-bit blocks of 0's and 1's in such a way that the sequence created by concatenating the labels encountered along any path in the encoder diagram would satisfy the asymmetric run-length constraints. An example of this type of encoder is shown in tabular form in FIG. 10 (for the 2/5 (1,9);(4,9) code) and in FIG. 13 (for the 4/5 (1,11);(0,1O) code).

This novel class of RLL coding is useful for recording data on optical media following correct initialization of the encoding system. A data bit 1, corresponding to an edge leading into state constraint $S_0$, can be present in the encoded data string as the first bit to be written to the optical medium (this is for convenience of illustration, the data may equally well begin with 0). The 1 is written to the medium as the leading edge of a mark. The minimum number of 0's before the next 1 is three for this example. During this time, the laser used in the write apparatus is pulsing on and continues to make a series of marks (in affect, forming a continuous mark). When the next encoded 1 is encountered, corresponding to a transition to $S_8$ from one of the constraint states $S_3 \ldots S_7$, the laser will write this as an end-of-mark, using the trailing edge of the mark to signify a 1. No mark is written as encoded 0's are encountered, corresponding to transitions to states constraint $S_9$–$S_{15}$. The number of these 0's is constrained to be from 1 to 7. At this time, the area on the medium being written to is between marks, so that a smaller minimum spacing is being covered until the next encoded 1 is encountered and the next mark begun.

In a practical system, this means that the minimum spacing for the areas where no mark is recorded is on the average less than the area under the marked regions and the coding accounts for the information accordingly. Therefore, the symmetric RLL (2,7) code is improved upon in terms of average linear density by a new code described as (1,7);(3,7) or (3,7);(1,7) (depending upon where the initial state is set).

FIG. 2c illustrates the result of applying an asymmetric constraint to two coding schemes. Note the increase in the recording density. The present invention represents a discovery that a code on the order of (d,k) can be made to achieve greater density if it is converted to implement as a (d1/d2,k) code (or $d_x, K_y$). The term converted is not meant to imply a simple conversion of existing coded data, although in its simplest embodiment this can indeed be done.

As previously discussed, current approaches to recording data on optical media employ the symmetric encoding schemes to increase density and to control data error propagation. It has been discovered that one embodiment of the present coding method can be realized in an apparatus that further encodes the existing RLL-encoded data to create the asymmetrical RLL encoded data. A circuit for obtaining this result is schematically illustrated in FIG. 3.

Figure 3A:
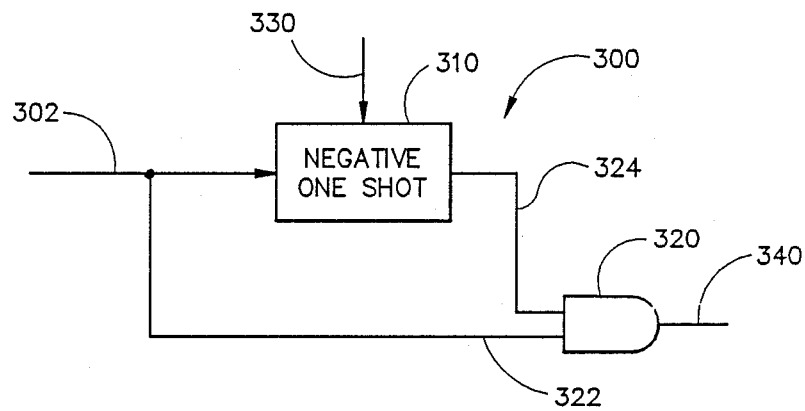
FIG. 3a illustrates an asymmetric data encoder constructed according to the principles of the present invention for encoding data for recording onto optical media.

In FIG. 3a, an encoder 300 comprises a single-shot or one-shot electronic device 310 and an OR gate 320. The input data string 302 is already RLL-encoded data which can be encoded under a variety of (d,k) constraints and may or may not be state dependent. The string 302 can be derived from several existing RLL encoders such as described in the previously mentioned U.S. Pat. No. 3,689,899 and represents a series of pulses and pulse transitions. For purposes of illustration the data will be assumed to have a symmetric RLL (2,7) coding.

The data is input to the single-shot device 310 which is an electronic device or circuit configured to provide an output pulse when it receives a negative-going transition. This occurs whenever the value of the data string 302 changes from a 1 to a 0 at the end of a PWM mark sequence. An exemplary device for the single-shot device 310 is a monostable multivibrator as commonly known in the electronic arts. Such a device outputs a pulse of fixed width or duration whenever it receives either a negative- or a positive-going pulse or transition, depending upon how it has been configured. The pulse length or duration can be selected to match the data clock period, or any other desired period. This is typically accomplished by using resistive and capacitive elements with the multivibrator circuit to set specific RC time constants that determine the reset timing and pulse duration. A retriggerable multivibrator can also be used so that a control signal, such as from a data clock, can extend the width of the pulse beyond the RC cutoff time.

In the alternative, a resettable monostable multivibrator can be employed with a reset or clear pulse provided from a source 330 which can be a data clock signal readily available from other circuitry. This allows the termination of the pulse width by a control source independent of the multivibrator circuitry. Therefore, a new pulse width (coding constraint) might be implemented without requiring direct alteration of the RC timing elements. In addition, one skilled in the art can employ other devices, such as logic gates, to control resetting or retriggering of the single-shot device 310 commensurate with a desired pulse width.

Figure 3B:
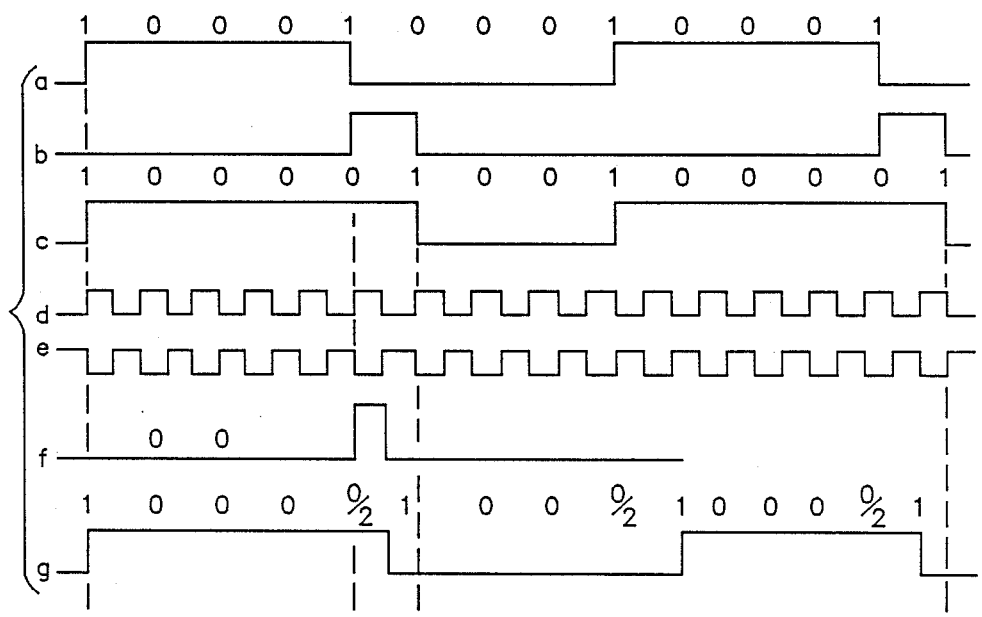

At the same time the input data 302 is communicated to the single-shot device 310, it is applied to a first input 322 of the OR gate 320. The output from the single-shot 310 is connected to a second input 324 of the OR gate 320. The OR gate 320 provides an output 340 that has a high pulse level whenever either of the input levels is high. Therefore, as long as the RLL encoded data has a high pulse level, as would be present for the period between two adjacent 1's in writing a mark to optical media, the output 340 level is high. The moment the mark ends, the trailing edge of the current data pulse will trigger an output from the single-shot device 310. While the data 302 level is now low, the output from the single-shot device 310 presents a high output level to the input 324 of the OR gate 320 which provides a continued high 340 output until the single-shot pulse drops low. This is illustrated in FIG. 3b where representative RLL data string is shown on line (a), the single-shot device 310 output on line (b), and the OR gate 320 output on line (c). After the single-shot device 310 resets itself, it makes no further contribution to the output pulse length from the OR gate 320 until the next negative going transition.

In this manner, a previously-encoded signal for a symmetric code has a single data bit 0 moved from one part of the code data string (non-mark) to an adjacent part (mark) so that one region always has two more minimum 0 counts than the next. This establishes the desired asymmetry. Therefore, a symmetrically-encoded input data string having a (2,7) coding constraint is altered to have a (3,8)–(1,6) coding constraint. Note that due to the manner in which the single-shot device 310 is triggered, the resulting output coding constraint also has a differing maximum value.

The width or length of the output pulse from the single-shot device 310 was presumed for purposes of illustration to be the same as one data clock pulse period. However, this is not required and an important attribute of the present invention is the fact that additional asymmetry is easily added and fractional asymmetry implemented by adjusting the pulse width for the single-shot device 310.

For additional asymmetry, the width of pulses provided by the single-shot device 310 can be adjusted to have a width in excess of one data clock period. By extending the width to that of several data clock pulses, additional data bit 0's are shifted to or from portions of the data string 340. A less preferred arrangement would be to use one or more additional single-shot devices and additional OR gates added in series with the output 340. The same timing relationship and pulsing would occur as before and additional asymmetric shifts in the encoded data would result.

In order to provide fractional asymmetry, the single-shot element 310 can be adjusted to have a pulse width less than the data clock period (adjusting RC timing) or is reset by a reset signal source 330 which has a fractional or phase shifted relationship to the data clock. That is, the signal source 330 does not provide a control pulse having the same width as the data clock pulse. For comparison, in FIG. 3b a standard clock pulse as would be commensurate with the illustrated data is shown on line (d) as well as an offset or phase shifted reset pulse on line (e).

If the single-shot device 310 is reset or cleared using the control pulse shown on line (e) of FIG. 3b, the pulse output in response to a negative-going transition in the input data string is the output pulse shown on line (f). The output pulse on line (f) is a narrower pulse than the previous output shown on line (c). Therefore, the output pulse 340 has a high pulse level extended by only a fractional data bit value, and the non-mark, low level, region shortened by a fractional value. This is illustrated in the pulse pattern on line (g) of FIG. 3b for the same data string input on line (a). Therefore, it is now possible to achieve encoding schemes having code constraints such as $(2\frac{1}{2},7\frac{1}{2})-(1\frac{1}{2},6\frac{1}{2})$. This allows a high degree of flexibility in tailoring RLL-encoded data to the area density limitations dictated by the optical media or the read/write system as opposed to being confined to particular data encoding constraints.

The encoded data 340 is transferred along a data channel to appropriate write apparatus for storage on optical media. At this point the pulses in the encoded data channel are used to modulate or control a laser write beam focused on the optical media. The modulation of the laser beam by the encoded data produces a variation in the energy deposited on the optical storage media that corresponds to the variation in the encoded data pulses. That is, a low level in a pulse train causes a low or zero level energy output by the laser and a high level causes a high level output, the high level being defined as an energy level that is above a predetermined threshold for affecting state alterations. The high level laser output creates the mark patterns on the optical media by altering the physical properties of the media as previously discussed above. Since the laser is typically a pulsed laser source the data modulation generally functions to turn the pulsed source on or off.

When data stored on optical media is to be accessed, a laser read beam is used to scan the optical media surface and detect localized changes in the properties of the media material. As previously discussed, this is typically manifested as a change in polarization of laser light reflected by the media, as caused by the mark regions. The polarization rotation is detected and used to modulate a voltage or pulse source to create a pulse train having predetermined voltage levels or pulses corresponding to the marks and lower voltage levels or non-pulse output for non-marks. These pulses are transferred along a data channel as a string of encoded data bits to be decoded.

Figure 4A:
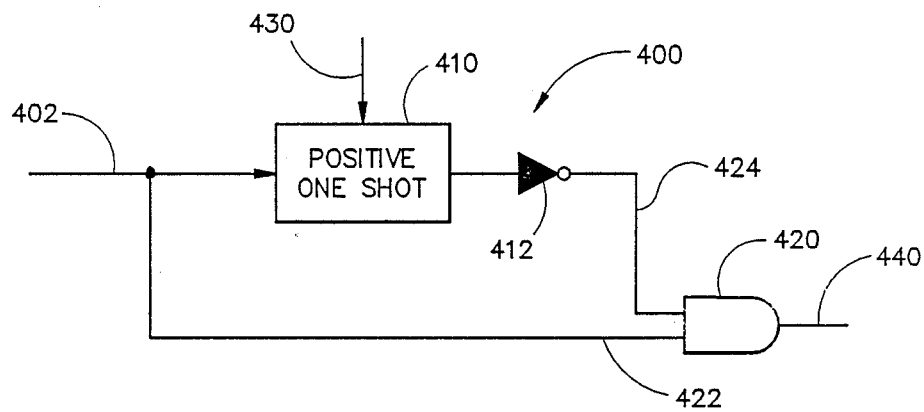
FIG. 4a illustrates an asymmetric data decoder constructed according to the principles of the present invention.
Figure 4B:
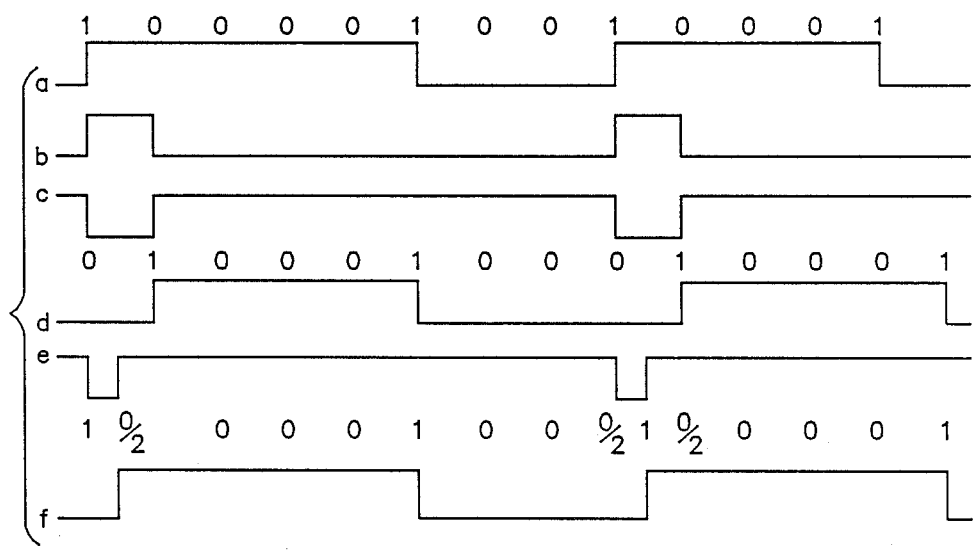

To decode the data recorded by the encoder 300 of FIG. 3a, a decoding circuit as illustrated in FIG. 4a is employed. In FIG. 4a, a decoder 400 receives encoded data 402 from a read detection circuit. The encoded data 402 is serially input to a single-shot device 410. An exemplary pulse level pattern for the data 402 is illustrated in FIG. 4b at (a). The single-shot device 410, like the single-shot device 310 can comprise elements known in the art such as a monostable multivibrator. The single-shot device 410 is configured to output a pulse whenever a positive-going transition is detected or received. Every time the encoded data string 402 goes to a high level or a 1 state the single-shot 410 will produce a pulse. Therefore, the single-shot device 410 will produce a pulse when the leading edge of a mark region is encountered.

At the same time the input data 402 is communicated to the single-shot device 410, it is applied to a first input 422 of an AND gate 420. The output from the single-shot 410 is inverted using an inverter 412 whose output is connected to a second input 424 of the AND gate 420. The resulting output 440 from the AND gate 420 is a positive pulse level whenever both of the input levels are positive. Therefore, as long as the RLL coded input data string has a positive pulse level and the single-shot device has not produced a pulse, the output 440 level is high.

When the single-shot device 410 detects a positive-going transition in the data string 402, it produces an output pulse shown on line (b). The device 410 output, through the inverter 412, places a low level signal at the input 424 and the AND gate 420 output 440 drops low. This condition occurs before the input encoded data 402 level drops low. This is illustrated in FIG. 4b where the encoded data string 402 is shown on line (a), the single-shot device 410 output on line (b), the inverter 412 output on line (c), and the AND gate 420 output on line (d). In this manner, a previously encoded signal having an asymmetric code constraint has a single data bit 0 moved from one part of the code data string (mark) to the adjacent portion (non-mark) so that the regions have the same minimum 0 count. This re-establishes the original symmetry prior to any further decoding or translation. Therefore, an input data string having the (3,8)-(1,6) coding constraint now has the (2,7) coding constraint.

As in the case of the encoder 300, the device 410 pulse width or timing is typically chosen to correspond with the data clock pulse. However, as before, the pulse width may be varied or a reset signal source 430 used to provide fractional or phase shifted resetting as compared to the data clock. This allows the decoder 400 to accommodate fractional encoding/decoding schemes such as $(2\frac{1}{2},7\frac{1}{2})-(1\frac{1}{2},6\frac{1}{2})$ if desired. This is illustrated in FIG. 4b on lines (e) and (f).

The advantage of the embodiments for the encoders and decoders just described is that they are extremely compatible with existing and proposed read/write circuitry and coding schemes for data storage on optical media. The single-shot devices may already exist as part of data edge detectors, read/write deskew circuits, or similar elements which can be adjusted to function in the manner required by the present invention. In this case an existing circuit can be retroactively adjusted to implement the method of the present invention and achieve the new asymmetric coding constraints.

Figure 5:
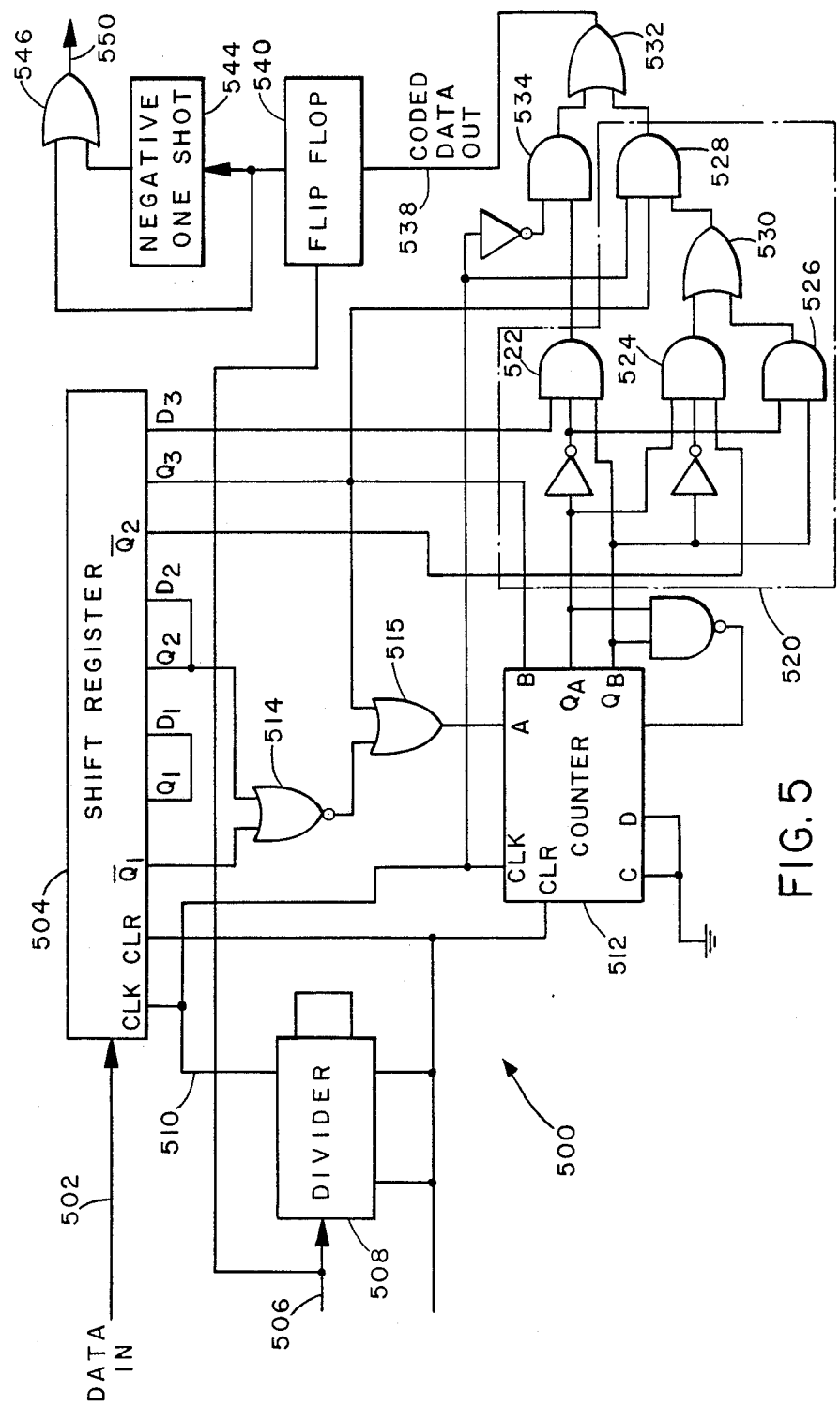
FIG. 5 illustrates a second asymmetric encoder according to the present invention for encoding "raw data" with an RLL 1/2 (1,6)–(3,8) constraint.

Another example of this type of circuitry is shown in the embodiment illustrated in FIG. 5. In FIG. 5, a data encoder 500 is configured to provide a 1/2 rate encoding of incoming "raw" data in an input data string 502 into asymmetrically encoded data using the (1,6);(3,8) coding constraint.

In the encoder 500, the raw data 502 is input to a 3-bit shift register 504. An external clock source 506, not shown, which can be supplied by the system oscillator signals normally available in associated optical media read/write circuitry, clocks a divider 508 which provides an appropriate clock signal 510 for the shift register 504 and other components of the encoder 500.

As an input data string 502 is shifted into the register 504, corresponding register outputs for the first three data bits are provided at register outputs $Q_3$, $Q_2$, and $Q_1$. These outputs are input to two inputs of a counter 512. An exemplary counter would be a 4-bit digital counter, of which only two bits are used for this embodiment. The $Q_3$ output which represents the first data bit shifted into the register 504, is connected directly to a first input (B) of the counter 512, whereas the second bit ($Q_2$) and complement of the third data bit outputs are connected in combination with $Q_3$ through two NOR gates 514 and 515 whose outputs are connected to the counter 512 at A. These inputs cause the counter 512 to present high or low signal levels at the counter outputs labeled $Q_A$ and $Q_B$. The $Q_A$ and $Q_B$ outputs are coupled to a combinatorial logic section 520 which uses the counter 512 outputs to determine where incoming data is to be partitioned and which data bits are being acted upon in a given partition of a data string. This partitioning allows patterns of incoming data bits to be folded into predetermined sets of output bits at the 1/2 rate. This provides a unique set of data string prefixes which can be decoded later.

The encoder output for the partitioned input is:

| INPUT DATA | OUTPUT DATA |
|---|---|
| 10 | 0100 |
| 11 | 1000 |
| 000 | 000100 |
| 010 | 100100 |
| 011 | 001000 |
| 0010 | 00100100 |
| 0011 | 00001000 |

The value of inputs B and A determine if a 2, 3, or 4 bit partition is employed with 00 being a 4 bit, 01 a 3-bit, and 10, a 2-bit respectively.

The values of B and A are themselves determined by the Boolean expressions:

$$B = Q_3$$

$$A = \overline{Q_3}(Q_2 + \overline{Q_1})$$

Once the logic in encoder 500 has determined the partition pattern, the first two data bits in the shift register 504 are acted upon by the AND gates 522, 524, 526, 528, and the OR gate 530. The output of these gates is transferred through OR gate 532 and the AND gate 534 as encoded data bits at the rate of two output bits for each input data bit. The AND gate 534 is clocked with the circuit clock 510 so that the output of the gate 528 is output first and then the output of the AND gate 534. The result is that the output of the AND gate 528 is the most significant bit (MSB) or leading number of a two bit data string 538 assigned to the first input data bit from data string 502 and the AND gate 520 outputs the least significant bit (LSB) of the encoded data string 538 assigned to the first input bit from the data string 502.

The data can then be input to a single-shot or one-shot device 544 and an OR gate 546 in a similar manner to the encoder 300, resulting in an asymmetrically encoded data string 550. It is also desirable to use a flip-flop 540 to provide a more useful or sharper pulse shape in the data signal 538 before the one-shot 544.

Figure 6:
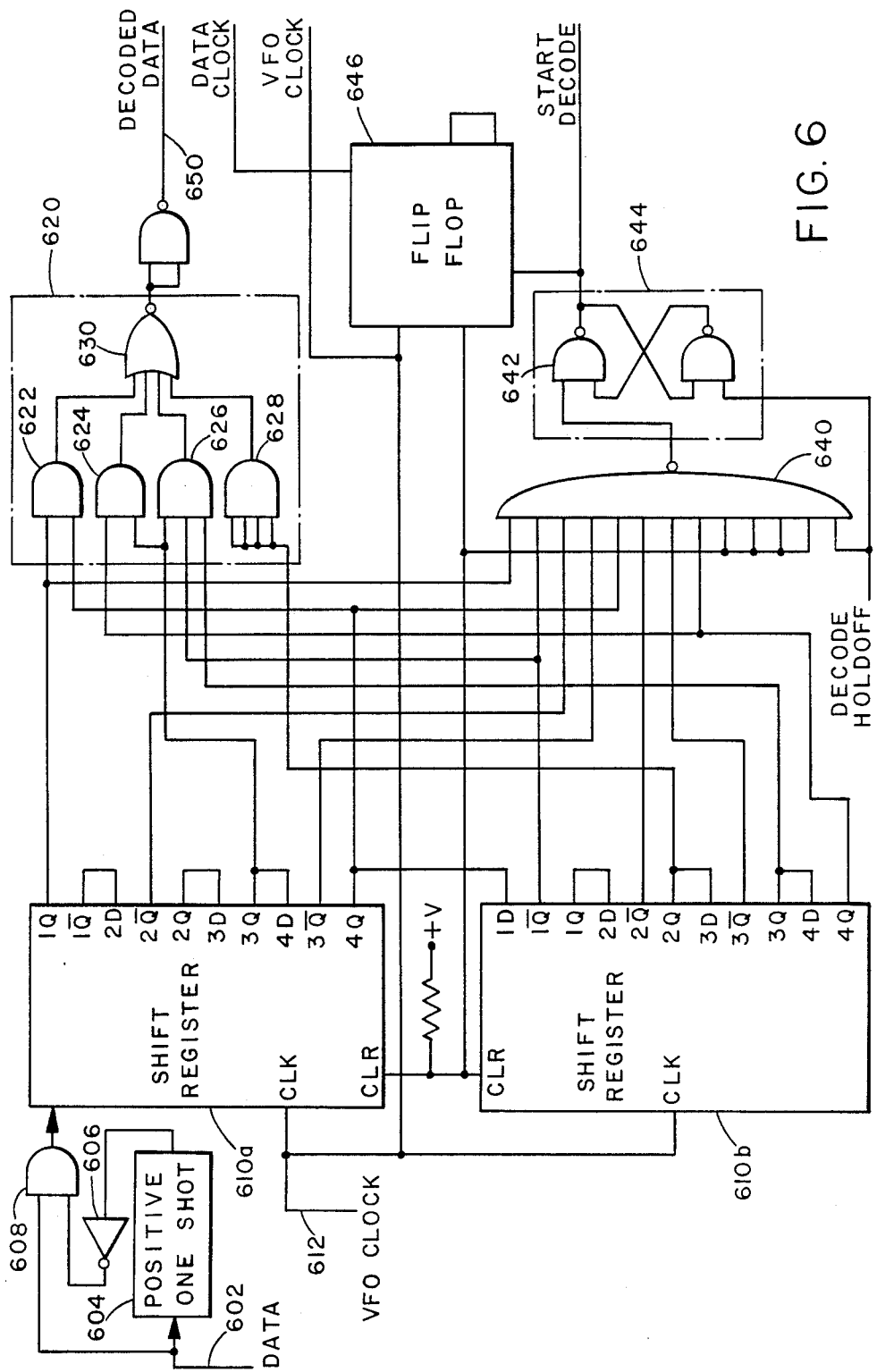
FIG. 6 illustrates a second asymmetric decoder according to the present invention for accepting data encoded with an RLL 1/2 (1,6)–(3,8) constraint.

To decode the asymmetrically encoded data string 550 when it is read from optical media at a later time, the circuit illustrated in FIG. 6 can be employed. In FIG. 6, a decoder 600 has the encoded data string 602 clocked into two 4-bit shift registers 610a and 610b, through a one-shot device 604, an inverter 606 and an AND gate 608, by a clock source 612. The clock source 612 is phase locked to the encoded data clock and is running at twice the desired data output clock in order to account for the initial 1/2 coding rate which now becomes a 2/1 decoding rate. The output from the shift registers 610 is fed to the combinatorial logic 620 which further comprises the four AND gates 622, 624, 626 and 628 as well as the NOR gate 630.

The particular matching of the register outputs to the gates is predetermined by the Boolean expressions which are required to be exercised on the data in order to achieve the desired coding function. Such combinatorial logic arrangements are illustrated in greater detail in U.S. Pat. Nos. 4,488,142 issued to P. A. Franaszek on Dec. 11, 1984, and 4,413,152 issued to Adler et al. Also the article "Algorithms for Sliding Block Codes, An Application of Symbolic Dynamics to Information Theory", by Roy Adler, et al, IEEE TRANSACTIONS ON INFORMATION THEORY, Vol. IT-29, No. 1, January 1983, pp 5–22 discusses the theoretical considerations and approaches to developing the encoding and decoding tables and resultant logic for symmetric (2,7) RLL code.

Therefore, the combinatorial logic 620 provides the actual decoding of the input data bit strings into the output data bits 650. However, in the case of the decoder 600 the data bits must be decoded only for valid sets of data bits. The AND gate 640 accomplishes this by observing the register outputs for a data synchronization mark pattern. Such synchronization patterns are known in the art of data encoding/decoding.

The output of the AND gate 640 causes a NAND gate 642 output to go low and a flip-flop 644 state to change. This indicates the start of a decode cycle, clearing a flip-flop 646 which strobes the registers 610.

While the embodiments described can easily implement asymmetric coding constraints with existing RLL circuits, this provides a larger maximum value for 0's in one region as well as the larger minimum (ie. $k_1 \neq k_2$). As previously discussed, increasing this maximum is not always desirable or tolerable by the data handling system. Therefore, an asymmetric code of the present invention must be implemented using a constraint of M/N $(d_1, K_1)-(d_2, k_2)$ with $k_1 = K_2$ in many applications.

An embodiment employing a $k_1 = k_2$ asymmetric encoding constraint on a data string for recording onto optical media is illustrated FIG. 7. FIG. 7 illustrates an encoder 700 for accepting "raw" data and encoding it using an NRZI 2/5 (1,9)–(4,9) coding constraint scheme. As previously described, the NRZI applies to the data string level pattern used (not return to zero and no change if no change in data 1's), and the 2/5 rate implies that two input data bits are converted to 5 encoded output data bits. Notice that for this embodiment a $d_1-d_2=3$ constraint is used to illustrate that the asymmetry can be established at a variety of levels and is not fixed by the previously illustrated single-shot.

The encoder 700 receives "raw" data 702 and applies it to a D input gate of a 2-bit D type shift register 704 where it is serially shifted through. A clock signal 706 is applied to the encoder 700 and is maintained at about 5 times the data clock rate. This is done in order to assure proper granularity and synchronization for the data. The clock input 706 is divided by five using a divide means 708 to provide a clock signal for the 2-bit register 704 so that it runs at the data clock rate. At the same time, the register clock signal is further divided by 2 in a divide means 710 and used to clock a 10-bit state register 712, to be discussed below. Another divide means 714 also divides the input clock signal 706 by 2 and provides a clock input to a 5-bit shift register 724.

The divider 714 causes the output register 724 to be clocked at a rate of 5 bits for every 2 bits shifted through the shift register 704. This creates the 2/5 data encoding rate specified in the code. The 10-bit state register 712 changes state every two input bits and therefore, requires the additional divide by 2 of the divider 710.

The data is shifted through the shift register 704 and appears across the outputs $Q_1$ and $Q_2$ which are connected to a decode logic device 716 along with the $Q_1$ and $Q_2$ outputs from the register 704. Since $Q_2$ represents the leading bit in a two bit data string such as 10, 01 or 11 the $Q_2$ output will be high for any leading bit being a 1 and the $Q_2$ output will be high for any data bit pair whose leading bit is a 0. These two lines can then be used for this discrimination in a set logic decode circuit 720.

The decode logic device 716 comprises simple combinatorial logic known in the electronics arts such as the four AND gates 718 shown in FIG. 7b which decode the register 704 output to produce desired high output signals for the 00, 01, 10, and 11 input data pairs. These data pairs are used to determine the coding that will be employed to encode two data bits into 5. However, the function of the decode logic device 716 could be incorporated into the set decode logic device 720.

This particular encoder is a state dependent encoder in that each encoding operation occurs with the circuitry set at a particular predetermined state and the next allowed encoding being dependent upon the previous state.

The data will be encoded according to the encoding table shown in FIG. 10 and labeled as Table I. Table I contains predefined states A through J which are established in the 10-bit state register 712 by a series of AND, OR gates and flip-flops, as would be apparent to one skilled in the art. The first state is chosen as state A and must also be the initial state chosen for decoding.

With the states determined by the register 712 the next state is determined by a go to state decoder 730. The go to state decoder 730 examines the current state that is being used for encoding and the current data being encoded. This is illustrated in FIG. 7a as the inputs A–J and 1 through 00 on the go to state decoder 730. Looking at Table 1, the coding scheme constrains the 10-bit state register 712 to be shifted to specific new states dependent upon the current input data bits being encoded and the previous state. The go to state decoder 730 uses a series of set state outputs which are connected to the 10-bit state register 712 to shift the current state in the state register 712 to its new value according to the coding constraints.

The set decode logic device 720 encodes input data from the register 704 using decode levels input from the decode logic device 716 and the current state input from the 10-bit state register 712 to determine the allowed output data bit patterns. For a given state and two of six types of input data bit patterns, a specific bit pattern is established on five output set lines 722 referred to as set 1 through 5.

Using Table I as a guide, the functions of the decoder 700 and the set decode logic can be illustrated by the Boolean expressions for the Encode Go To State Logic in Table II below and Encoder Set Decode Logic in Table III below.

TABLE II

| ENCODE GO TO STATE LOGIC | |
|---|---|
| A = 00 | (D + E + F) + 01 (E + F) + 11 (I + J) |
| B = 01 | (F + I + J) + 11 (F) |
| C = 00 | (H) + 10 (G + H) |
| D = 01 | (A + B + H + J) + 11 (G + H) |
| E = 00 | (A + J) |
| F = 00 | (B + C) |
| G = 01 | (C) |
| H = 01 | (D + G + I) + 10 (A + B + C + E) + 11 D |
| I = 11 | (A + B + E) |
| J = 00 | (I) + 10 (D) |

TABLE III

| ENCODER SET DECODE LOGIC | |
|---|---|
| Set 1 = | 10 (A + B + C + E) |
|  | + 11 (A + B + C + E + I + J) |
|  | + 0x (E + F) |
|  | + 00 (D) |
| Set 2 = | 10 (I + J) |
|  | + 01 (D) |
|  | + 1x (F) |
| Set 3 = | 1x (D + H + G) |
|  | + 00 (D) |
| Set 4 = | 0x (G + H) |
|  | + 00 (E + F) |
|  | + 11 (F) |
| Set 5 = | 0x (J) |
|  | + 01 (E + F) |
|  | + 1x (G) |
|  | + 10 (F) | where x is don't care

With these expressions in mind an example of the encoding process for the asymmetric (1,9);(4,9) encoding constraint or scheme is now illustrated.

Assume an input raw data string of 1010011111 is input into the encoder 700 of FIG. 7a starting at a time t=0 when the initial state is set to A and all of the registers are cleared to the initial states accordingly, which can be done by a signal to the write status input 732 of the registers. The two bit input data pattern produced by the register 704 is illustrated as the top line of FIG. 8.

The first two bits, 10, will provide an output at the Set 1 of 5-bit register 720 according to Table I and the expression for set 1, of a 1 or high level since the register 712 is in state A and the input is 10. The output for set 2 is 0 since the register 712 is not in states I or J. The output for set 3 is 0 since the register 712 is not in states D, H, or G. The output for set 4 is 0 since the input is 10, and the output for set 5 is 0 since the register 712 is not in states E or F. Therefore, the data bit pattern 00001 is stored in the 5-bit register 724 for transferring out of the encoder 700. This is illustrated on the second line of FIG. 8. Note the last data bit (reading left to right) in this string is set 1 (LSB) and the first is set 5 (MSB).

The next data bit pairs in the input data 10, 01, 11, and 11 result in the subsequent output bit sets 00100, 00000, 10100, and 00100, also shown in FIG. 8. These patterns result from the expressions used for the first two bits in an input data string.

The encoded output data string 740 becomes 00001001000000001010000100. If the initial recording of data is automatically started as a mark or a data 1 bit, which can be subtracted out later, then this data string breaks down according to the bottom line of FIG. 8 into alternating mark and non-mark regions having (1)00001 00 1000000001 0 100001 and 00 data bits recorded therein respectively. Notice that this makes the non-mark regions for optical media consistently shorter than the marked regions leading to the improvement in linear recording density.

The encoded data is output from the 5-bit shift register 724 through a dc trigger flip flop 728 to produce an encoded data string 750 that has transitions at each data one edge as opposed to high logic only for data bit ones. This is then used to drive a NRZI type recording system. Note that the 5-bit shift register 724 is loaded every 5 bits as determined by an output timer 726.

In order to decode the data that has been encoded according to the circuitry of FIG. 7, a decoder 900 is employed as illustrated in FIG. 9. The decoder 900 now must use a series of look-up tables in order to discern the next states allowed by the data to determine the presently allowable decoding pattern.

An encoded data string 902 is detected from the optical media using one of many optical data read systems now used or proposed. The data string 902 is input in serial fashion into a 15-bit shift register 904. The shift register 904 is clocked by a data clock source 906 which also clocks an output timer 908. The decoding process begins when 15 bits of input data is clocked into the register 904.

Output signals from the 15-bit shift register 904 representing the first 5 bits of the data string 902 are transferred to a set decode logic device 912 which will interpret the signals, or input bits, as a group of five "sets" as previously seen in the encoder 700. The set decode logic 912 will output two sets or data bits 914 based on what output bits are assigned to given input sets by the coding constraints.

The set decode logic element 912 accomplishes this decoding by using look-ahead techniques that are understood by those skilled in the art. The next two sets of 5 data bits that are in the shift register 904 are read by the look-ahead logic element 916. This look-ahead element 916 simply provides a high level output on output lines Q through Z dependent upon the data bit patterns in the 15-bit shift register 904. FIG. 11 shows the tables that are used to establish a given output for lines Q through Z.

For example, if the second 5 data bits represented as shift register outputs $Q_6$–$Q_{10}$ and look-ahead logic inputs F-J, are 00001, then the Q output line from the look-ahead logic 916 will be high. Also, the S, R, X, Y, and Z lines will be high with the remaining lines low. This informs the decode logic 912 that the blocks S, R, X, Y, or Z contain the trailing or following data bit patterns and to decode the present 5 bits of encoded input data accordingly.

The logic used by the decode logic 912 is presented in the table of FIG. 12. Here for a given input pattern of 5 bits a specific output is provided for a given look-ahead block being registered by the set decode logic device 912. The listing below summarizes the relationship between the input data bit patterns and the look-up tables that have that data pattern within its structure. However, at any one time, only one look-ahead block will be valid.

| Encoded Bit | No. of Blocks Found in | Blocks | |
|---|---|---|---|
| 00000 | 2 | Q | T |
| 00001 | 2 | W | Z |
| 00010 | 2 | W | Y |
| 00100 | 2 | U | X |
| 00101 | 1 | — | — |
| 01000 | 2 | R | U |
| 01001 | 1 | — | — |
| 01010 | 1 | — | — |
| 10000 | 2 | S | V |
| 10001 | 1 | — | — |
| 10010 | 1 | — | — |
| 10100 | 2 | V | Y | where a "—" indicates a unique string

Using Table 5, we can see how specific data is decoded into specific 2-bit strings of decoded data.

Using the example from before (FIG.'s 7 and 8), a string of data bits in the form 0000100100000001010000100 is input to the decoder 900 as the previously encoded and now read data 902. This data is shifted into the 15-bit shift register 904 where it will be decoded by the set decode logic 912 and the look-ahead decode logic 916. The 5-bit blocks will be broken out as 00001, 00100, 00000, 10100, and 00100 by the shift register 904.

Referring to the decoding Table V, the first 5 bits can provide either a 10 or 11 data bit set output to a register 918 where it is shifted out as output 920. However, the look-up table values associated with the 10 output is W and with 11 is Z. By looking at the next 5-bits, we see that they are 00100 and these are in the W block, but not the Z block. Therefore, the W line from the look-ahead decode logic device 916 will be high but not the Z line, telling the set decode logic device 912 that the decoding process must select 10 as the current output. The next 5 bits will yield either 10 or 11, but the correct look-ahead selection will select line X high and the output will be 10. This process continues down through the encoded data string 902 to decode the data and provide an encoded data string 920 of 1010011111.

It will be apparent to those skilled in the art that additional logic or alternative circuits may be employed to reduce the number of interconnections required in the encoder 700 or the decoder 900. It is not required that each state or look-ahead block be represented as a single output over a distinct output line.

A run-length-limited encoding procedure which encodes consecutive four-bit symbols of an unconstrained, unencoded data string into consecutive five-character symbols of an encoded data string, and which alternates the coding constraints between (0,10) and (1,11) is fully described in the encoding table of FIG. 13. In FIG. 13, the response of an encoder for unencoded symbols (INPUT) is given in the columns headed STATE. Each column shows the response of an encoder when in a particular encoding state to each possible combination of four unencoded input bits. The response is two-fold, and includes the next encoding state and an output symbol of five encoded characters. In FIG. 13, the code symbols output are given in their NRZ form: that is, lands are indicated by the character "+", marks by the character "−". These characters form a binary alphabet; they are easily translated into NRZI form by the following rule: the current character translates to "1" if different from its predecessor and to "0" if identical with it. The run-length constraints apply to the NRZI form, but marks are more easily differentiated from lands under the NRZ form.

The encoder described by FIG. 13 has fourteen encoding states, State 1–State 14. For each encoding state, there is a list of 16 pairs of the form "next encoding state/coded output", corresponding to the 16 possible four-bit input symbols of unencoded data. For example, assume the encoder is in State 3 and that 1000 represents the next four bits to be encoded. In response to the combination of the present state and the unencoded input bits, the encoder will emit the response 3/−−−−+, wherein "3" is the next encoding state and "−−−−+" the encoded output. The unencoded data string is divided into a succession of overlapping 4-bit blocks (INPUT), each encoded by an apparatus which looks up the next state and the output in the table corresponding the current state. The output is concatenated to the previous outputs, and the next state becomes the current state for encoding the next 4-bit block data.

Figure 14:
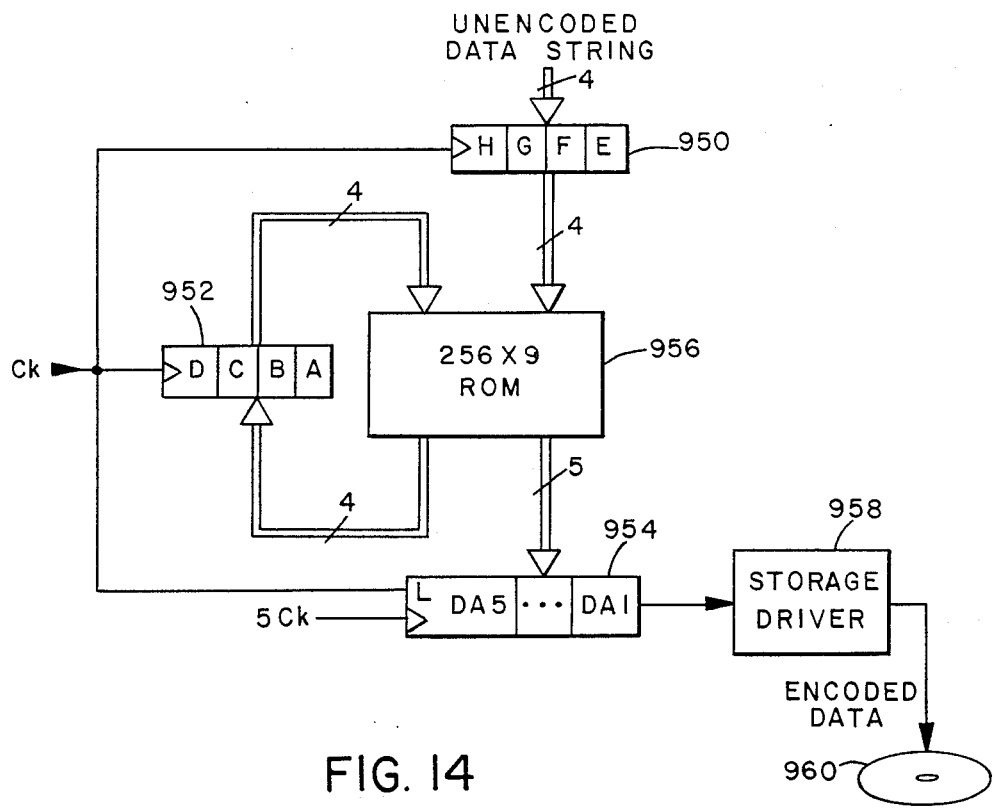
FIG. 14 is a block diagram of a table-driven encoder which operates according to the encoding table of FIG. 13.

FIG. 14 illustrates a table-driven embodiment of the encoder of FIG. 13. The encoder includes conventional registers 950, 952, 954 clocked by a clock waveform, Ck, in combination with a programmable read-only-memory (ROM) 956 and a storage driver 958. The state tables are conventionally programed into the ROM 956, each table entry being stored at an address location "Current States/Input". In the embodiment of FIG. 14, the address is an eight-bit number ABCDEFGH, wherein ABCD indicate the current state, and EFGH the four-bit block to be encoded. The ROM 956 outputs a nine-bit word, ST1-ST4 DA1-DA5, in which ST1-ST4 are four bits representing the next state, and DA1-DA5 are five bits representing the coding output. The operations of the encoder are synchronized by the response of the registers 950, 952, 954 to the Ck waveform. In this regard, the registers 950 and 952 hold EFGH and ABCD, respectively, while the ROM 956 is providing the "Next State/Output" in the form ST1-ST4 (Next State) to the input of the register 952 and DA1-DA5 (Output) to the input of register 954. When the waveform Ck transitions, the next four-bit block of unencoded data is entered into the register 950, ST1-ST4 into the register 952, and DA1-DA5 into the register 954.

Signal format conversion and concatenation of the encoded data are performed by the storage driver 958. Storage of the formatted encoded data is done in the storage medium 960. In this regard, the driver 958 serializes and converts the output obtained from the register 954, and presents the output in the form of suitable drive signals to the storage medium 960. Those skilled in the art will realize that the entire encoding process implied by the table of FIG. 13 necessarily involves the activity of a format converter such as the driver 958 to properly format the "+'s" and "-'s" at the table for provision to the preferred medium of storage (or transmission).

The ROM 956 can be implemented in discrete logic according to the Boolean expressions of FIG. 15. In FIG. 15, the signals ST1-ST4 and DA1-DA5 correspond to those described above in connection with the ROM 956, as do the terms A-H. In the notation of FIG. 15, adjacency denotes the logical AND function, and "+", the logical OR function. Underlining of a term denotes the complement of the underlined term. Each of the terms in FIG. 15 corresponds to a respective combinatorial logic gate which is conventionally configured according to the expression.

Figure 17:
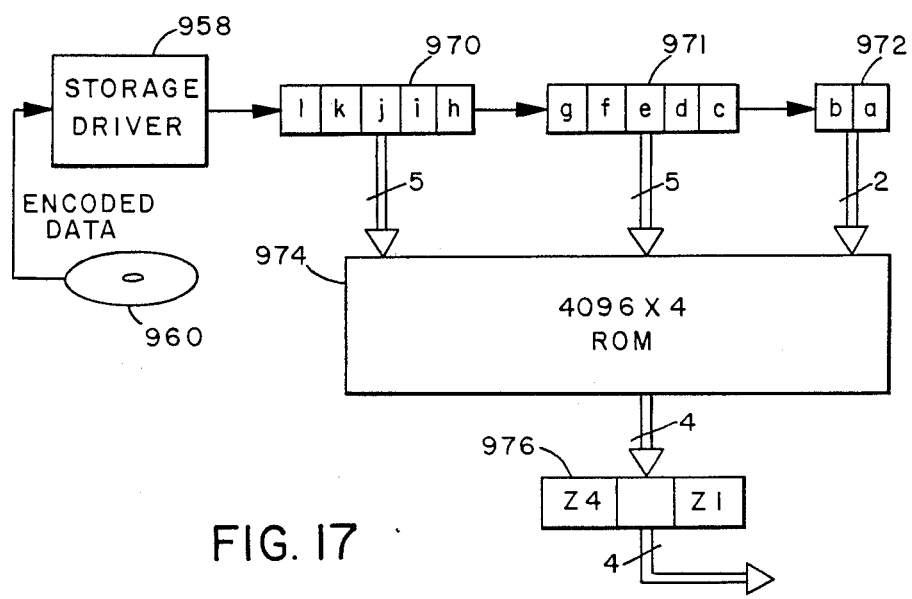
FIG. 17 is the block diagram of a decoder driven according to the decoding table of FIG. 16.

The decoding process complementary to the encoding process of FIG. 13 is illustrated in the tables of FIG. 16. With reference also to FIG. 17, when the encoded data on the storage medium 960 is to be retrieved, it is detected first by the storage driver 958, converted and formatted to a digital form, and provided as a string of encoded data to the three serially-connected registers 970-972. Decoding a string of data encoded according to FIG. 13, requires knowledge of 12 consecutive characters in order to decode a block of five bits. The 12 characters include the two characters preceding the block and the five characters following it. In FIG. 16, the 12 characters are denoted by ab cdefg hijkl, where each letter represents one of two binary characters (+ or −). In the mechanization of FIG. 16, encoded characters are provided serially to the registers 970-972, with characters ba in the register 972, characters gfedc in the register 971, and characters lkjih in register 970. Decoding is implemented in a table-driven form according to the table of FIG. 16, which is conventionally entered into the read-only-memory (ROM) 974. The ROM 974 responds to a 12-bit address representing the 12 consecutive characters required to decode cdefg because the decoder could be described by a table providing the four-bit output block corresponding to each 12-character input string. However, a more compact representation of the decoder is given in the pair of tables in FIG. 16. To decode a five-character block, cdefg, first find ab cdefg in the upper table, where "." denotes don't care. Reading across the row, there are two or more numbers in the range 0-15, whose binary representations are the possible decoded blocks. The columns containing the numbers are labeled (A1 and A2), or (B3, B4, and B5), or (C9, C10, C11, and C12), or (D37 and D48). The lower tables used to choose the correct column from which to read a number. In the lower table, the column hijkl is used to find the current value of the five characters following the block to be decoded. Beside this column is a list of column labels A, B, C, and D. Since the possibilities found in the first table all come from columns whose labels begin with one letter, only one of these labels will be on the list.

The decoded data is the binary representation of the number found in the row of the upper table selected by ab cdefg and in the columns whose label appears beside hijkl in the lower table. After decoding block cdefg, the characters in the registers 970-972 are shifted in five positions to the right, and the next block of five symbols is decoded.

By way of example, let the string which is to be decoded be:

$$\ldots +--+--+--++---++$$
$$+--+----+++\ldots$$

In this partial string of characters, the values of the five characters to be decoded (cdefg) are −+−−+. The values of the index parameters into the first table of FIG. 16, ab cdefg, are +− −+−−+, which corresponds to the sixteenth line of the table. The entries on the sixteenth line of the first table provide 3 binary representations of the decoded data, with the selection being made according to the line in the second table of FIG. 16 indexed by the current values of hijkl. In this case, these values are −−++−, corresponding to the sixth line of the second table. The sixth line of the second table selects column B3, representing the first table column from which the decode data is to be obtained. Returning to the intersection of column B3 in line 16 in the first table, the four-bit binary representation of 3 (0011) is provided as the decoded output. Now, the symbol string fragment is shifted five positions to the right, giving −+−−++− as the first table index, which maps to line 6 of the first table, where 1 and 5 in columns A1 and A2, respectively, are found. The next block −−−++, indexes to line 4 of the second table in FIG. 16, resulting in the selection of column A1 in the first table, and resulting in the provision of a decoded output consisting of the binary representation of the 1 (0001).

The table-driven decoder of FIG. 17 includes a four-bit wide decoder table with 4096 addressable storage locations, each containing the four-bit data block resulting from decoding a five-character block in a block of 12 consecutive symbols as explained above. Each storage location corresponds, therefore, to a respective one of the 4096 possible bit patterns of a 12-bit character block.

The combinatorial logic for a decoder operating according to the tables in FIG. 16 is given in FIG. 18. In FIG. 18, the notation is changed so that AB CDEFG HIJKL is called W4W5 X1X2X3X4X5 Y1Y2Y3Y4Y5. The 4-bit block produced by the decoder is: Z1Z2Z3Z4. Those skilled in the art will recognize that the Boolean expressions of FIG. 18 can be conventionally implemented in available logic technology.

What has been described is a new class of data codes known as asymmetric data codes which provides an asymmetrical spacing of 0's between adjacent 1's. Also, apparatus for realizing the new class of codes have been described which are useful for a variety of encoding/decoding applications.

The foregoing description of the preferred embodiments has been presented for purposes of illustration and description. It is not intended to be exhaustive nor to limit the invention to the precise form disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What is claimed is:

1. A method of asymmetrically encoding an input string of binary data bits into an output string of binary coding characters, said input string having the form of a sequence of 1's and 0's, said output string having the form of a sequence of code characters drawn from a binary character alphabet including first and second code characters, said method comprising the steps of:
   recursively encoding said input string according to a run-length-limited code having a code constraint $M/N(d_1,K_1); (d_2,K_2)$, where M is the number of data bits encoded during a recursion and N is the number of code characters produced by encoding M data bits, $d_1$ and $d_2$ are minimum numbers of said first code characters occurring between adjacent second code characters in said output string, and $k_1$ and $k_2$ are maximum numbers of said first code characters occurring between adjacent second code characters in said output string; and
   alternating between the constraints $(d_1,k_1)$ and $(d_2,k_2)$ in response to the occurrence of said second code characters in said output string.

2. The method of claim 1 wherein $k_1=k_2$.

3. The method of claim 2 wherein $k_1 \neq k_2$.

4. The method of claim 1 wherein $d_1$, $d_2$, $k_1$, and $k_2$ include fractional numerical values.

5. The method of claim 1 further comprising the steps of:
   generating a run-length-limited output string from said input string according to the constraint $M/N(d_0,k_0)$; and
   in response to the occurrence of said second code character, adjusting the values of d and k by an amount x, wherein $(d_1,k_1)=(d_0+x,k_0+x)$ and $(d_2,k_2)=(d_0-x,k_0-x)$.

6. The method of claim 5 wherein said first code character is a 0, said second code character is a 1, and said asymmetrical run-length-limited encoded data string includes negative-going and positive-going transitions, said method further comprising:
   providing a variable-width pulse generator responsive to said asymmetrical run-length-limited encoded data string; and
   wherein, said step of adjusting includes:
      the step of generating a single pulse of variable width in response to each negative-going transition in said asymmetrical encoded run-length-limited data string; and
      combining said asymmetrical data string and pulses resulting from said step of generating to produce an output data string having positive transitions that are substantially in phase with corresponding positive-going transitions in said asymmetrical encoded data string and having negative transitions that are delayed in phase from corresponding negative transitions in said asymmetrically encoded data string by an amount based upon the width of said pulses.

7. In an apparatus for generating constrained, run-length-limited (RLL)-encoded data from a serialized string of input data bits including positive-going transitions and negative-going transitions, wherein said apparatus generates N output data bits in response to M input data bits and generates output data bit 0's between output data bit 1's based upon a run-length-limited coding constraint (d, k) where d represents the minimum number of output data bit 0's between adjacent output data bit 1's, the improvement comprising:
   means for alternating the values of said coding constraint between $(d_1,k_1)$ and $(d_2,k_2)$, wherein $d_1 \neq d_2$.

8. The apparatus of claim 7 wherein said means for alternating further comprises:
   means for generating pulses of variable width, each pulse being generated in response to a negative-going transition in a symmetrical encoded run-length-limited input data string; and
   combining means responsive to said input data string and pulses from said means for generating a single pulse for producing an output data string having positive transitions that are substantially in phase with corresponding positive transitions in said input data string and having negative transitions that are delayed in phase with corresponding negative transitions in said input data string by an amount based upon the width of said pulses from said means for generating a single pulse.

9. An apparatus for generating asymmetrically encoded data from a symmetrically encoded run-length-limited input data string including positive-going transitions and negative-going transitions, comprising:
   means for generating a single pulse of variable width in response to each negative-going transition in said symmetrically encoded run-length-limited input data string;
   combining means responsive to said input data string and to pulses from said means for generating a single pulse for producing an output data string having positive transitions that are substantially in phase with corresponding positive transitions in said input data string and having negative transitions that are delayed in phase with corresponding negative transitions in said input data string by an amount based upon the width of said pulses from said means for generating a single pulse.

10. The apparatus of claim 9 wherein said means for generating a single pulse comprises a monostable multivibrator.

11. The apparatus of claim 9 further comprising means for resetting said means for generating a single pulse at a predetermined rate.

12. The apparatus of claim 11 wherein said means for generating a single pulse comprises a resettable monostable multivibrator.

13. An apparatus for generating symmetrically encoded data from an asymmetrically encoded run-length-limited input data string including pluralities of negative- and positive-going transitions, comprising:
means for generating a single pulse of variable width in response to each positive-going transition in said input data string;
means for inverting the pulses produced by said single pulse means connected to said single pulse means output; and
combining means responsive to said RLL encoded input data string and pulses from said means for inverting for producing an output data string having negative transitions that are substantially in phase with corresponding negative transitions in said input data string and having positive transitions that are delayed in phase by an amount based upon the width of said pulses from said means for generating a single pulse.

14. The apparatus of claim 13 wherein said means for generating a single pulse comprises a monostable multivibrator.

15. The apparatus of claim 13 further comprising means for resetting said means for generating a single pulse at predetermined rate.

16. The apparatus of claim 15 wherein said means for generating a single pulse comprises a resettable monostable multivibrator.

17. In an RLL coding system, an apparatus for generating an asymmetrically RLL-encoded data string from an unencoded input data string at a rate M/N, where M is a number of input data bits to be encoded and N is the number of output data bits resulting from said encoding, said encoded data string characterized by alternating RLL code constraints $(d_1,k_1)$; where $d_1$ and $d_2$ are minimum numbers of 0's between adjacent 1's in said encoded data string and $k_1$ $k_2$ are maximum numbers of 0's between 1's in said encoded data string, said apparatus comprising:
a shift register for receiving said input data string and for providing a group of M input bits;
state register means for holding an encoding state;
logic means for providing a set of N output bits reflecting the constraint associated with said present state in response to said group of M input bits and said present state;
selection means connected to said shift register and to said state register means for combining said M input bits with said encoding state to determine a next encoding state based upon an asymmetric code constraint sequence in which constraint states associated with said constraint $(d_1,k_1)$ alternate with constraint states associated with said constraint $(d_2,k_2)$, and for providing said next encoding state; and
updating means for shifting the next group of M input bits into said shift register, for concatenating said set of N output bits for said encoded data stream, and for replacing said present encoding state in said register means with said next encoding state.

18. The apparatus of claim 17 further comprising timing means connected to said shift register, said logic means, and said selection means for synchronizing the transfer of input and output data bits through said apparatus at said M/N coding rate.

19. The apparatus of claim 17 wherein said shift register comprises an M-bit shift register for receiving M bits of said input data and providing M normal and M complementary outputs.

20. The apparatus of claim 17 further comprising output shift register means for providing a serial string of N data bits to an output data channel for each set of N bits provided by said logic means.

21. The apparatus of claim 20 further comprising timing means connected to said shift register, said logic means, said selection means, and said output shift register for gating said selection means at 1/M times the rate of said shift register and for gating said output means at N/M times the rate of said shift register.

22. The apparatus of claim 20 further comprising a triggered flip-flop having an input connected to the output of said output register means and an output for connection to an output data channel.

23. The apparatus of claim 17 further comprising a decode logic means for generating signals indicative of consecutive 1's and 0's in said input data in response to the data bits stored in said shift register, said decode logic means being coupled to said logic means so as to enhance the determination of the current pattern of data bits in said shift register.

24. The apparatus of claim 23 wherein said selection means has a plurality of inputs which are coupled on a one to one relationship to outputs of said state means and to said decode logic means for detecting the current state and said consecutive 1's and 0's, respectively, for determining the next state.

25. An apparatus for generating a decoded output data string from an asymmetric encoded run-length-limited input data string at an N/M rate, where N is a number of input data bits to be decoded and M is the number of output data bits resulting from said decoding where said encoded run-length-limited input data was encoded using the coding constraint M/N $(d_1,k_1);(d_2,k_2)$, where $d_1$ and $d_2$ are minimum numbers of 0's between encoded data bits 1's, and $k_1$ and $k_2$ are maximum numbers of 0's between encoded data bit 1's, comprising:
shift register means for receiving a predetermined number of data bits in said encoded input data string, said predetermined number being greater than N;
adjacency means for detecting a pattern in every N data bit present in said input data string and comparing said pattern with pre-defined sequences of data bit patterns and generating a signal indicative of the pre-defined bit pattern every N data bits in said input data string are associated with; and
set decode logic means for providing M output data bits for every N bits of input data in response to said generated signal from said adjacency means and the data bits present in said shift register means, based on the predetermined values of $d_1$ and $d_2$ and $k_1$ and $k_2$ for said M/N $(d_1,k_1);(d_2,k_2)$ coding constraint and the predetermined combinations of allowed data bit patterns.

26. The apparatus of claim 25 further comprising output shift register means for shifting said M bits from said set decode logic means to said apparatus for decoding as a serialized string to unencoded output data bits along a data channel.

27. The apparatus of claim 26 further comprising timing means connected to said input shift register means, said adjacency means, said output shift register means for shifting input and output data bits through said apparatus at said N/M decoding rate.

28. The apparatus of claim 27 wherein said timing means provides clock signals to said output shift register means at a rate of N/M times the clock rate of said shift register means.

29. An optical data recording system, comprising:
a modulatable source of optical recording signals;
an optical recording means for receiving and optically recording a modulated optical recording signal from said source; and
coding means for modulating said source according to an asymmetrical run-length-limited code including first coding symbols and second coding symbols, in which alternate first coding symbols are separated by a constraining number of second coding symbols and the constraining number changes value with an occurrence of a first coding symbol.

30. The optical data recording system of claim 29 wherein said coding means comprises:
means for generating N output data bits in response to M input data bits and for generating data bit 0's between data bit 1's based upon a run-length-limited (d,k) coding constraint where d represents the minimum number of data bit 0's and k the maximum number of data bit 0's between adjacent data bit 1's; and
means for alternating values of d and k as used by said means for generating output data bits to alternate between a value $d_1$ and $d_2$ and a value $k_1$ and $k_2$, respectively, where $d_1 \neq d_2$.

31. The optical data recording system of claim 29 wherein said coding means comprises:
means for generating a single pulse of variable width in response to each negative-going transition in a asymmetrical encoded run-length-limited input data string, said asymmetrical encoded run-length-limited input data string including positive-going transitions and negative-going transitions; and
combining means responsive to said input data string and pulses from said means for generating a single pulse for producing an output data string having positive transitions that are substantially in phase with corresponding positive transitions in said input data string and having negative transitions that are delayed in phase with corresponding negative transitions in said input data string by an amount based upon the width of said pulses from said means for generating a single pulse.

32. The system of claim 29 wherein said coding means includes an apparatus for generating an asymmetrically encoded data string from an unencoded input data string at an M/N rate, where M is the number of input data bits and N is the number of encoded output data bits, having the code constraint M/N $(d_1,k_1);(d_2,k_2)$, where $d_1$ or $d_2$ is a predetermined value denoting the minimum number of 0's between data bit 1's and $k_1$ or $k_2$ is a predetermined value denoting the maximum number of 0's between data bit 1's comprising:
shift register means for receiving said input data string;
state means for defining a sequence of predetermined states for said apparatus, each state of each sequence allowing the encoding of M bits of input data to be predetermined N bits of asymmetrically encoded output data 14 according to the coding constraint corresponding to that sequence;
set logic means for detecting a current pattern of M data bits in said shift register means and providing an output set of N bits in response to both said current pattern and a current state defined by said state means; and
selection means for choosing a next state of a sequence in response to the set of N bits provided by said set logic means and the current state defined by said state means, based on the predetermined values of $d_1$ and $d_2$ and $k_1$ and $k_2$ for said current state, said selection means being coupled to said state means so as to shift said state means to the next state.

33. The system of claim 29 wherein said coding means includes an apparatus for generating an unencoded data string from an asymmetric encoded run-length-limited input data string an an N/M rate, where N is the number of input data bits and M is the number of output data bits, where said encoded run-length-limited input data was encoded using the coding constraint M/N $(d_1,k_1);(d_2,k_2)$, where $d_1$ or $d_2$ is a predetermined value denoting the minimum number of 0's between data bits 1's and $k_1$ or $k_2$ is a predetermined value denoting the maximum number of 0's between data bit 1's, comprising:
shift register means for receiving a predetermined number of data bits in said encoded input data string, said predetermined number being greater than N;
look ahead means for detecting a pattern in every N data bits present in said input data string and comparing said pattern with pre-defined sequences of data bit patterns and generating a signal indicative of the pre-defined bit pattern every N data bits in said input data string are associated with; and
set decode logic means for providing M output data bits for every N bits of input data in response to said generated signal from said look ahead means and the data bits present in said shift register means based on the predetermined values of $d_1$ and $d_2$ and $k_1$ and $k_2$ for said M/N $(d_1,k_1);(d_2,k_2)$ coding constraint and the predetermined combinations of allowed data bit patterns.

34. In an optical data recording system having an optical recording means for receiving and optically recording a modulated optical recording signal, method for optically recording data in an asymmetrical, RLL-encoded form, said method comprising the steps of:
receiving a string of unencoded bits having the form of a serialized string of 1's and 0's;
RLL-encoding said unencoded data string using a coding constraint in the form of M/N (d,k), where M is the number of input data bits, N is the number of output bits associated therewith, d has a value denoting the minimum number of 0 data bits between adjacent 1's, and k has a value denoting the maximum number of 0 data bits between adjacent 1's; and
alternating the values of d and k between a value $d_1$ and $d_2$ and a value $k_1$ and $k_2$ respectively, where $d_1 \neq d_2$, to produce an asymmetrically encoded data string; and
modulating an optical recording signal directed against said recording means with said asymmetrically encoded data string to produce an asymmetrically encoded run-length-limited recorded optical signal.

35. An apparatus for generating an unencoded data string from an asymmetrically-coded run-length-limited input data string at a rate N/M, where N is a number of input data bits to be decoded and M is the number of output data bits resulting from said decoding, where said input data string has been encoded using the coding constraint M/N $(d_1,k_1);(d_2,k_2)$, where $d_1$ and $d_2$ are minimum numbers of 0's between encoded data bit 1's, and $k_1$ and $k_2$ are maximum numbers of 0's between unencoded data bit 1's, comprising:

a shift register for receiving a predetermined number P of data bits in said encoded input data string, wherein P is greater than N; and decode logic means for decoding a group of M output data bits from a predetermined group of N input data bits in said shift register means, said decoding being performed in response to said P input data bits present in such shift register means.

36. The apparatus of claim 35 wherein M=2, N=5, $d_1=1$, $k_1=9$, $d_2=4$, $k_2=k_1$, P=15.

37. The apparatus of claim 35 wherein M=4, N=5, P=12, $d_1=0$, $k_1=10$, $d_2=1$, $k_2=11$.

38. The apparatus of claim 37 wherein said decoded logic means comprises a read-only memory (ROM) having 4096 storage locations and a four bits stored at each location, each location being addressed by the input data bits in said shift register means.

39. The apparatus of claim 37 where in said decoded logic means comprises combinatorial logic.

40. A method for encoding a series of unconstrained binary input symbols into an asymmetrical run-length limited (d,k) code through use of an encoding table circuit, including:

recursively, providing an input symbol comprising M bits, and a state signal indicating a present encoding state to an encoding table circuit, and producing an output symbol comprising N characters drawn from a binary character set including first and second binary characters, and a state signal indicating a next encoding state for use in the next recursion, from said encoding table circuit; and concatenating successive output symbols into an encoded string in which d and k are minimum and maximum numbers of second binary characters occurring between adjacent first binary characters and (d, k) alternates between values $(d_1, k_1,)$ and $(d_2, k_2)$ with each occurrence of a first binary character in said encoded string.

41. The method of claim 40, wherein M=4 bits, N=5 characters, said state signals each include four state bits, and said step of recursively providing and producing is performed according to the following table:

| INPUT | STATE 1 | STATE 2 | STATE 3 | STATE 4 | STATE 5 |
|---|---|---|---|---|---|
| 0000 | 3/−++++ | 1/−+++− | 3/+−−−+ | 9/++−−− | 1/+−−+− |
| 0001 | 3/−−+++ | 11/−+−−− | 1/−−++− | 11/++−−− | 3/−−+++ |
| 0010 | 3/−−−++ | 10/−+−−− | 3/−−−++ | 10/+−−−− | 10/−+++− |
| 0011 | 3/−+−−+ | 2/−−−+− | 2/−−−+− | 11/−−+−− | 11/+++−− |
| 0100 | 5/−−−++ | 2/−+++− | 5/−−−++ | 10/++−−− | 2/+−−+− |
| 0101 | 5/−−+++ | 12/−+−−− | 2/−−++− | 12/++−−− | 5/−−+++ |
| 0110 | 4/−+−−+ | 9/−++−− | 4/+−−−+ | 9/−−−−− | 4/−+++++ |
| 0111 | 5/−+−−+ | 11/−−−−− | 5/+−−−+ | 11/−−−−− | 3/−++++ |
| 1000 | 3/−−−−+ | 10/−−+−− | 3/−−−−+ | 10/−−+−− | 1/++++− |
| 1001 | 4/−−+++ | 1/−−−+− | 1/−−−+− | 13/−−−−− | 4/−−+++ |
| 1010 | 4/−−−−+ | 9/−−+−− | 4/−−−−+ | 9/−−+−− | 2/−++++ |
| 1011 | 5/−−−−+ | 12/−−−+− | 5/−−−−+ | 12/−−+−− | 12/++−−− |
| 1100 | 1/−−++− | 10/−++−− | 3/+−−−+ | 10/−−−−− | 3/+−−++ |
| 1101 | 4/−++++ | 11/−++−− | 4/++−−+ | 11/+−−−− | 4/+−−++ |
| 1110 | 4/−−−++ | 9/−+−−− | 4/−−−++ | 9/+−−−− | 9/+++−− |
| 1111 | 5/−+++++ | 12/−++−− | 5/++−−+ | 12/+−−−− | 5/+−−++ |

| INPUT | STATE 6 | STATE 7 | STATE 8 | STATE 9 | STATE 10 |
|---|---|---|---|---|---|
| 0000 | 1/+−−+− | 3/+−−−+ | 1/+−−+− | 3/+−−+− | 9/++−−− |
| 0001 | 3/−−+++ | 1/−−++− | 3/−−+++ | 1/+−−+− | 11/++−−− |
| 0010 | 10/+++−− | 3/−−−++ | 10/+−−−− | 3/++−−+ | 10/+++−− |
| 0011 | 11/+++−− | 2/−−−+− | 11/−−+−− | 3/−+−−+ | 11/+++−− |
| 0100 | 2/+−−+− | 5/−−−++ | 2/+−−+− | 2/+−−+− | 10/++−−− |
| 0101 | 5/−−+++ | 2/−−++− | 5/−−+++ | 5/+−−+− | 12/++−−− |
| 0110 | 8/+++++ | 4/+−−−+ | 9/−−−−− | 4/+−−−+ | 9/−++−− |
| 0111 | 7/+++++ | 5/+−−−+ | 11/−−−−− | 5/+−−−+ | 11/−+−−− |
| 1000 | 1/+++++− | 3/−−−−+ | 10/−−+−− | 1/++++− | 10/−+−−− |
| 1001 | 4/−−+++ | 1/−−−+− | 13/−−−−− | 4/−−−−+ | 12/−+−−− |
| 1010 | 2/+++++− | 4/−−−−+ | 9/−−+−− | 2/++++− | 9/−+−−− |
| 1011 | 12/+++−− | 5/−−−−+ | 12/−−+−− | 5/++−−+ | 12/+++−− |
| 1100 | 3/+−−++ | 3/+−−++ | 10/−−−−− | 3/+−−++ | 10/−++−− |
| 1101 | 4/+−−++ | 4/+−−++ | 11/+−−−− | 4/+−−−+ | 11/−+−−− |
| 1110 | 9/+++−− | 4/−−−++ | 9/+−−−− | 4/++−−+ | 9/+++−− |
| 1111 | 5/+−−++ | 5/+−−++ | 12/+−−−− | 5/+−−++ | 12/−++−− |

| INPUT | STATE 11 | STATE 12 | STATE 13 | STATE 14 |
|---|---|---|---|---|
| 0000 | 3/−++++ | 1/−+++− | 1/−+++− | 3/−++++ |
| 0001 | 3/+++++ | 1/−−++− | 1/−−++− | 1/−−++− |
| 0010 | 3/−−−++ | 10/+−−−− | 10+−−−− | 10/+−−−− |
| 0011 | 11/−−+−− | 2/−−−+− | 2/−−−+− | 11/−−+−− |
| 0100 | 5/−−−++ | 2/−+++− | 2/−+++− | 2/−+++− |
| 0101 | 6/+++++ | 2/−−++− | 2/−−++− | 2/−−++− |
| 0110 | 4/−−+++ | 9/−−−−− | 9/−−−−− | 4/−−+++ |
| 0111 | 5/−−+++ | 11/−−−−− | 14/−−−−− | 5/−−+++ |
| 1000 | 10/−−+−− | 3/−−−−+ | 3/−−−−+ | 10/−−+−− |
| 1001 | 4/+++++ | 1/−−−+− | 1/−−−+− | 4/+++++ |
| 1010 | 9/−−+−− | 4/−−−−+ | 4/−−−−+ | 9/−−+−− |

-continued

| | | | | |
|---|---|---|---|---|
| 1011 | 12/--+-- | 5/----+ | 5/----+ | 12/--+-- |
| 1100 | 3/--+++ | 10/----- | 10/----- | 3/--+++ |
| 1101 | 4/-++++ | 11/+---- | 11/+---- | 4/-++++ |
| 1110 | 4/---++ | 9/+---- | 9/+---- | 9/+---- |
| 1111 | 5/-++++ | 12/+---- | 12/+---- | 5/-++++ |

FORMAT:
INPUT = pattern of M input data bits
STATE Y = decimal representation of the present encoding state
Y'/N = encoding table entry where Y' is decimal representation of next coding state and N is the pattern of output characters
+,- = Representation of first and second binary characters, respectively.